US012787665B2

(12) United States Patent
Arnold et al.

(10) Patent No.: US 12,787,665 B2
(45) Date of Patent: Nov. 3, 2026

(54) SURFACE-WATER-ASSISTED DEPOSITION OF PATTERNED FILMS OF ALIGNED NANOPARTICLES

(71) Applicant: Wisconsin Alumni Research Foundation, Madison, WI (US)

(72) Inventors: Michael Scott Arnold, Middleton, WI (US); Sean Foradori, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 438 days.

(21) Appl. No.: 18/366,300

(22) Filed: Aug. 7, 2023

(65) Prior Publication Data

US 2025/0054755 A1 Feb. 13, 2025

(51) Int. Cl.
*H10P 14/20* (2026.01)
*H10D 30/01* (2025.01)
(Continued)

(52) U.S. Cl.
CPC ....... *H10P 14/3464* (2026.01); *H10D 30/014* (2025.01); *H10D 30/43* (2025.01);
(Continued)

(58) Field of Classification Search
CPC ......... H01L 21/02606; H01L 21/02381; H01L 21/02488; H01L 21/02527;
(Continued)

(56) References Cited

U.S. PATENT DOCUMENTS

| | | | |
|---|---|---|---|
| 6,741,017 | B1 | 5/2004 | Ide et al. |
| 7,151,209 | B2 | 12/2006 | Empedocles et al. |

(Continued)

FOREIGN PATENT DOCUMENTS

| | | |
|---|---|---|
| CN | 1656264 | 8/2005 |
| JP | 2001284274 A | 10/2001 |

(Continued)

OTHER PUBLICATIONS

Extended European Search Report mailed in European Patent Application No. 15748675.4, Aug. 25, 2017.

(Continued)

*Primary Examiner* — Eliseo Ramos Feliciano
*Assistant Examiner* — Timothy Edward Duren
(74) *Attorney, Agent, or Firm* — Bell & Manning, LLC

(57) ABSTRACT

Methods of forming films of aligned elongated nanoparticles, films made using the methods, and electronic devices, such as transistors, that incorporate the films are provided. In the methods, elongated nanoparticles floating at the surface of a liquid film are deposited onto a liquid film-adsorbing surface region of a substrate as the liquid film dissipates from the surface. The alignment and deposition of the elongated nanoparticles occurs along a contact line that is defined by the liquid film, the substrate, and either an immiscible liquid suspension of the elongated nanoparticles or air. As the liquid film dissipates, the contact line recedes across the liquid film-adsorbing surface region and elongated nanoparticles pinned at the contact line are deposited onto the surface in the form of a nanoparticle film.

20 Claims, 22 Drawing Sheets

(51) Int. Cl.

| | |
|---|---|
| ***H10D 30/43*** | (2025.01) |
| ***H10D 62/17*** | (2025.01) |
| ***H10P 14/26*** | (2026.01) |
| ***H10P 76/20*** | (2026.01) |

(52) U.S. Cl.
CPC ......... *H10D 62/235* (2025.01); *H10P 14/265* (2026.01); *H10P 14/2905* (2026.01); *H10P 14/3238* (2026.01); *H10P 14/3406* (2026.01); *H10P 76/204* (2026.01)

(58) Field of Classification Search
CPC .......... H01L 21/02628; H01L 21/0273; H10D 30/014; H10D 62/235; H10D 30/43
USPC .......................................................... 257/213
See application file for complete search history.

(56) References Cited

U.S. PATENT DOCUMENTS

| | | | | |
|---|---|---|---|---|
| 7,226,818 | B2 | 6/2007 | Malenfant et al. | |
| 7,422,980 | B1 | 9/2008 | Duan et al. | |
| 7,875,320 | B2 | 1/2011 | Park et al. | |
| 8,128,993 | B2 | 3/2012 | Rueckes et al. | |
| 8,313,795 | B2 | 11/2012 | Kadono | |
| 8,455,055 | B1 | 6/2013 | Humfeld | |
| 9,368,723 | B2 | 6/2016 | Arnold et al. | |
| 9,425,405 | B1 | 8/2016 | Arnold et al. | |
| 9,673,399 | B2 | 6/2017 | Arnold et al. | |
| 9,786,853 | B2 | 10/2017 | Arnold et al. | |
| 10,833,284 | B1 * | 11/2020 | Kane | C01B 32/158 |
| 10,873,026 | B2 | 12/2020 | Arnold et al. | |
| 11,631,814 | B2 | 4/2023 | Arnold et al. | |
| 2003/0180472 | A1 | 9/2003 | Zhou et al. | |
| 2004/0192072 | A1 | 9/2004 | Snow et al. | |
| 2005/0208304 | A1 | 9/2005 | Collier et al. | |
| 2006/0081882 | A1 | 4/2006 | Malenfant et al. | |
| 2006/0286023 | A1 | 12/2006 | Huang | |
| 2007/0246784 | A1 | 10/2007 | Kang et al. | |
| 2008/0160290 | A1 | 7/2008 | Park et al. | |
| 2008/0199626 | A1 | 8/2008 | Zhou et al. | |
| 2008/0224123 | A1 | 9/2008 | Martin et al. | |
| 2008/0296563 | A1 | 12/2008 | Bourgoin et al. | |
| 2009/0035469 | A1 | 2/2009 | Sue et al. | |
| 2009/0214816 | A1 | 8/2009 | Hata et al. | |
| 2009/0246408 | A1 | 10/2009 | Chan et al. | |
| 2009/0267060 | A1 | 10/2009 | Forrest et al. | |
| 2010/0065829 | A1 | 3/2010 | Forrest et al. | |
| 2010/0101983 | A1 | 4/2010 | Butler et al. | |
| 2010/0127242 | A1 | 5/2010 | Zhou et al. | |
| 2010/0183844 | A1 | 7/2010 | Xiong et al. | |
| 2010/0233360 | A1 | 9/2010 | Lee et al. | |
| 2010/0247381 | A1 | 9/2010 | Yodh et al. | |
| 2010/0320140 | A1 | 12/2010 | Nowak et al. | |
| 2011/0143541 | A1 | 6/2011 | Ogawa | |
| 2014/0120714 | A1 | 5/2014 | Farmer et al. | |
| 2014/0342098 | A1 | 11/2014 | Curran et al. | |
| 2015/0209198 | A1 | 7/2015 | Aizenberg et al. | |
| 2016/0254468 | A1 * | 9/2016 | Joo | C01B 32/159 257/29 |
| 2017/0047460 | A1 | 2/2017 | Naseem et al. | |
| 2018/0261772 | A1 * | 9/2018 | Arnold | H10K 71/12 |

FOREIGN PATENT DOCUMENTS

| | | | | |
|---|---|---|---|---|
| JP | 2002-226209 | | | 8/2002 |
| JP | 2013-141631 | | | 7/2013 |
| JP | 2024036861 | A | * | 3/2024 |
| TW | 200947070 | A | * | 11/2009 |
| WO | 2007/015710 | A2 | | 2/2007 |
| WO | 2009002624 | A1 | | 12/2008 |
| WO | 2011087913 | | | 7/2011 |
| WO | 2013154490 | | | 10/2013 |
| WO | 2015/123251 | | | 8/2015 |

OTHER PUBLICATIONS

Assad, O. et al., Spray-Coating Route for Highly Aligned and Large-Scale Arrays of Nanowires. ACS Nano 6, May 3, 2012, pp. 4702-4712.

Binder, Wolfgang H. "Supramolecular assembly of nanoparticles at liquid-liquid interfaces." Angewandte Chemie International Edition 44.33 (2005): 5172-5175.

Börzsönyi et al., Orientational Order and Alignment of Elongated Particles Induced by Shear. Phys. Rev. Lett. 108, Jun. 1, 2012, pp. 228302-1-228302-5.

Börzsönyi et al., Shear-induced alignment and dynamics of elongated granular particles. Phys. Rev. E 86, Nov. 21, 2012, pp. 051304-1-051304-8.

Brickweg et al., Shear-induced 1-D alignment of alumina nanoparticles in coatings. J. Coat. Technol. Res. 4, Nov. 1, 2006, pp. 107-110.

Cao et al., Arrays of single-walled carbon nanotubes with full surface coverage for high-performance electronics, Nat. Nanotechnol., vol. 8, Jan. 27, 2013, pp. 180-186.

Derenskyi et al., Carbon Nanotube Network Ambipolar Field-Effect Transistors with 108 On/Off Ratio. Adv. Mater. 26, Jul. 19, 2014, pp. 5969-5975.

Dong et al., Anomalous orientations of a rigid carbon nanotube in a sheared fluid, Scientific Reports 4 : 6120, Aug. 19, 2014, pp. 1-7.

Dong et al., "Online Supplement: Anomalous orientations of a rigid carbon nanotube in a sheared fluid", for paper published in Scientific Reports 4 : 6120, Aug. 19, 2014, pp. 1-7.

Engel et al., Thin Film Nanotube Transistors Based on Self-Assembled, Aligned, Semiconducting Carbon Nanotube Arrays, ACS Nano, vol. 2, Dec. 9, 2008, pp. 2445-2452.

Feng, Tao, David A. Hoagland, and Thomas P. Russell. "Assembly of acid-functionalized single-walled carbon nanotubes at oil/water interfaces." Langmuir 30.4 (2014): 1072-1079.

Fry et al., Anisotropy of Sheared Carbon-Nanotube Suspensions. Phys. Rev. Lett. 95, Jul. 15, 2005, pp. 038304-1-038304-4.

Giancane et al., State of art in the preparation, characterisation and applications of Langmuir-Blodgett films of carbon nanotubes, Colloids and Surfaces A: Physicochem. Eng. Aspects 354, Oct. 2, 2009, pp. 81-90.

Hong et al., Improved Density in Aligned Arrays of Single-Walled Carbon Nanotubes by Sequential Chemical Vapor Deposition on Quartz, Adv. Mater., vol. 22, Jan. 7, 2010, pp. 1826-1830.

Huang et al., Directed Assembly of One-Dimensional Nanostructures into Functional Networks, Science, vol. 291, Jan. 26, 2001, pp. 630-633.

Jeong, et al., Fabrication of efficient field emitters with thin multiwalled carbon nanotubes using spray method. Carbon 44, Jun. 5, 2006, pp. 2689-2693.

Jin et al., Using nanoscale thermocapillary flows to create arrays of purely semiconducting single-walled carbon nanotubes , Nat. Nanotechnol., vol. 8, No. 5, Apr. 28, 2013, pp. 347-355.

Jinkins et al., "Substrate-Wide Confined Shear Alignment of Carbon Nanotubes for Thin Film Transistors," Adv. Electron. Mater. 2019, 5, 1800593.

Jinkins et al., "Nanotube Alignment Mechanism in Floating Evaporative Self-Assembly," Langmuir 2017, 33, 46, 13407-13414 Publication Date:Oct. 23, 2017 https://doi.org/10.1021/acs.langmuir.7b02827 Copyright © 2017 American Chemical Society.

Joo et al., "Dose-controlled, floating evaporative self-assembly and alignment of semiconducting carbon nanotubes from organic solvents," Langmuir, Mar. 2, 2014, vol. 30, pp. 3460-3466.

Kang et al., High-performance electronics using dense, perfectly aligned arrays of single-walled carbon nanotubes, Nat. Nanotechnol., vol. 2, No. 4, Mar. 25, 2007, pp. 230-236.

Kim et al., Low voltage, high performance inkjet printed carbon nanotube transistors with solution processed ZrO2 gate insulator, App. Phys. Lett., vol. 103, No. 8, Aug. 23, 2013, pp. 082119-1-082119-4.

Ko et al., "Liquid-Crystalline Processing of Highly Oriented Carbon Nanotube Arrays for Thin-Film Transistors," Nano Letters, 2006, vol. 6, No. 7, 1443-1448.

(56) References Cited

OTHER PUBLICATIONS

Lemieux et al., Self-sorted, aligned nanotube networks for thin-film transistors, Science, vol. 321, Jul. 4, 2008, pp. 101-104.
Li et al., "Langmuir-Blodgett Assembly of Densely Aligned Single-Walled Carbon Nanotubes from Bulk Materials," J. Am. Chem.Soc. 2007, 129, 4890-4891.
Ma et al., "Experimental observation on the flow-induced assembly of Carbon nanotube suspensions to form helical bands," Rheol Acta (2007) 46:979-987.
Ma et al., The production of horizontally aligned single-walled carbon nanotubes, Carbon, vol. 49, Jun. 24, 2011, pp. 4098-4110.
Matsui et al., "Simple Fabrication of Carbon Nanotube Monolayer Film," Chemistry Letters vol. 35, No. 1, (2006) pp. 42-43.
Matsui et al., "Fabrication of densely packed multi-walled carbon nanotube ultrathin films using a liquid-liquid interface," Journal of Materials Chemistry 17 36 (2007) 3806-3811.
Matsui, Jun, Kohei Yamamoto, and Tokuji Miyashita. "Assembly of untreated single-walled carbon nanotubes at a liquid-liquid interface." Carbon 47.6 (2009): 1444-1450.
Mistry et al., High-Yield Dispersions of Large-Diameter Semiconducting Single-Walled Carbon Nanotubes with Tunable Narrow Chirality Distributions, ACS Nano, vol. 7. No. 3, Feb. 4, 2013, pp. 2231-2239.
Miyata et al., Length-sorted semiconducting carbon nanotubes for high-mobility thin film transistors, Nano. Research, vol. 4, No. 10, Oct. 2011, pp. 963-970.
Park et al. Large-Area Assembly of Densely Aligned Single-Walled Carbon Nanotubes Using Solution Shearing and Their Application to Field-Effect Transistors. Adv. Mater. 27, Mar. 18, 2015, pp. 2656-2662.
Pierard et al., "Production of short carbon nanotubes with open tips by ball milling," Chemical Physics Letters 335 (2001) 1-8.
Qian et al., Electrical and Photoresponse Properties of Printed Thin-Film Transistors Based on Poly(9,9-dioctylfluorene-co-bithiophene) Sorted Large-Diameter Semiconducting Carbon Nanotubes, J. Phys. Chem. C, vol. 117, Aug. 8, 2013, pp. 18243-18250.
Sangwan et al., Fundamental Performance Limits of Carbon Nanotube Thin-Film Transistors Achieved Using Hybrid Molecular Dielectrics, ACS Nano, vol. 6, No. 8 , Jul. 11, 2012, pp. 7480-7488.
Schwenke, Konrad, Lucio Isa, and Emanuela Del Gado. "Assembly of nanoparticles at liquid interfaces: crowding and ordering." Langmuir 30.11 (2014): 3069-3074.
Sgobba et a., "Langmuir-Schaefer Films for Aligned Carbon Nanotubes Functionalized with a Conjugate Polymer and Photoelectrochemical Response Enhancement," ACS Appl. Mater. Interfaces, 2014, 6, 1, 153-158.
Shastry et al., Large-area, electronically monodisperse, aligned single-walled carbon nanotube thin films fabricated by evaporation-driven self-assembly, Small, vol. 9, Sep. 17, 2012, pp. 45-51.
Shekhar et al., Ultrahigh density alignment of carbon nanotube arrays by dielectrophoresis, ACS Nano, vol. 5, Feb. 16, 2011, pp. 1739-1746.
Sun et al., Flexible high-performance carbon nanotube integrated circuits, Nat. Nanotechnol., vol. 6, No. 3, Feb. 6, 2011, pp. 156-161.
Tardani et al, "Shear Orientation in Nematic Carbon Nanotube Dispersions: A Combined NMR Investigation," J. Phys. Chem. C. 2013, 117, 8556-8562.
Wang et al., "Coating Carbon Nanotubes with Polymer in supercritical carbon dioxide," Chemical Communications, No. 15, Jan. 1, 2006, p. 16701672.
Wu et al., Self-Assembly of Semiconducting Single-Walled Carbon Nanotubes into Dense, Aligned Rafts, Small, Jul. 11, 2013, vol. 9, No. 24, pp. 4142-4148.
Yao et al., A nanoscale combing technique for the large-scale assembly of highly aligned nanowires. Nat. Nanotechnol. 8, Apr. 21, 2013, pp. 329-335.
Zhang et al., "Directing single-walled carbon nanotubes to self-assemble at water/oil interfaces and facilitate electron transfer," Chem. Commun., 2008, 4273-4275.
Zhang et al., "Carbon Nanotubes as Liquid Crystals," Small, 2008, 4, No. 9, 1270-1283.
Zhang et al., Facile One-Step Fabrication of Ordered Organic Nanowire Films, Advanced Materials 21, Jun. 24, 2009, pp. 4172-4175.
Zhu et al., Scalable alignment and transfer of nanowires in a spinning Langmuir film. Nanoscale 6, Aug. 5, 2014, pp. 11976-11980.
International Search Report and Written Opinion in International Patent Application No. PCT/US2024/034602 dated Dec. 10, 2024, 11 pages.
Ko, et al., "Combing and bending of carbon nanotube arrays with confined microfluidic flow on patterned surfaces," Journal of Physical Chemistry. B , American Chemical Society, Columbus, OH, US, Mar. 13, 2004, pp. 4385-4393, vol. 108, XP002375199, ISSN: 1520-5207, DOI: 10.1021/JP031229E.

* cited by examiner

SURFACE-WATER-ASSISTED DEPOSITION OF PATTERNED FILMS OF ALIGNED NANOPARTICLES

REFERENCE TO GOVERNMENT RIGHTS

This invention was made with government support under 1727523 awarded by the National Science Foundation. The government has certain rights in the invention.

BACKGROUND

Semiconducting carbon nanotubes (CNTs) are one-dimensional materials with exceptional electronic properties. Field effect transistors fabricated with CNT-based channels have been shown to exhibit current density greater than silicon and gallium arsenide transistors. (Brady, Gerald J., et al., "Quasi-ballistic carbon nanotube array transistors with current density exceeding Si and GaAs", Science Advances, 2017, Volume 2, Issue 9) CNTs' high current carrying capacity and the ability to easily modulate their conductivity due to their small diameter make them promising materials for next generation communication and logic devices. Maximizing the performance of CNT-based transistors requires that the CNTs in the transistors are aligned and arranged into densely packed monolayer arrays.

High purity semiconducting CNTs are available as suspensions in aqueous and organic solvents, referred to as inks. The fabrication and deposition of aligned arrays of CNTs onto substrates from inks has been investigated using shear, vacuum filtration, directed evaporation, dielectrophoresis, evaporative self-assembly, blown-bubble assembly, gas flow self-assembly, spin-coating, contact-printing assembly, elastomeric release, dimension-limited self-alignment, DNA directed assembly, and Langmuir-Blodgett and -Schaefer methods, among others.

Some alignment methods accumulate CNTs at the interface between two immiscible liquids or between a liquid and a gas. CNTs can self-align at such interfaces, and the aligned CNTs can be picked up or deposited onto substrates. For example, it has been observed that spreading thin layers of polymer wrapped CNTs dispersed in organic solvents, like chloroform, on top of a water bath results in the self-alignment of the CNTs at the interface between the chloroform and water (Joo, Yongho, et al., "Dose-Controlled, Floating Evaporative Self-assembly and Alignment of Semiconducting Carbon Nanotubes from Organic Solvents," Langmuir, 2014, Volume 30, Issue 12, pages 3460-3466), (Jinkins, Katherine R., et al., "Nanotube Alignment Mechanism in Floating Evaporative Self-Assembly, Langmuir, 2017, Volume 33, Issue 46, pages 13407-13414.). Using this effect, CNT assemblies can be transferred to large-area substrates by continuously flowing thin layers of the CNT ink over the surface of an aqueous subphase and simultaneously lifting a target substrate through the flowing ink layer at constant velocity—in a process termed tangential flow interfacial self-assembly (TaFISA).

SUMMARY

Methods of forming films of aligned elongated nanoparticles, films made using the methods, and electronic devices, such as transistors, that incorporate the films are provided. Also provided are methods of forming a patterned substrate for use in the film-forming methods.

One embodiment of a method of forming a film of aligned elongated nanoparticles on a substrate includes the steps of: providing a substrate having at least one liquid film-adsorbing surface region bounded by at least one liquid film-repelling surface region; forming a liquid film on the at least one liquid film-adsorbing surface region, wherein the liquid film is bounded by the at least one liquid film-repelling surface region: contacting a suspension that comprises dispersed elongated nanoparticles with the at least one liquid film, wherein the suspension is immiscible with the at least one liquid film, such that the at least one liquid film and the suspension form an interface and elongated nanoparticles are transferred from the suspension to a surface of the at least one liquid film at the interface; and allowing the at least one liquid film to dissipate, whereby the elongated nanoparticles are deposited on the at least one liquid film-adsorbing surface region along a contact line defined by: the liquid film: the substrate; and the suspension or air, as the liquid film dissipates.

One embodiment of a method of patterning a silicon dioxide surface of a substrate with one or more hydrophilic surface regions bounded by one or more less hydrophilic surface regions includes the steps of: forming a layer of a resist on the silicon dioxide surface; patterning the layer of resist to expose one or more regions of the silicon dioxide surface through the layer of resist: depositing a layer of yttrium metal or a layer of scandium metal over the layer of resist and the one or more exposed regions of the silicon dioxide surface to form yttrium metal-coated or scandium metal-coated surface regions on the silicon dioxide surface: removing the patterned layer of resist from the silicon dioxide surface: oxidizing the yttrium metal or scandium metal on the silicon dioxide surface: forming a layer of material having a lower hydrophilicity than the silicon dioxide on the silicon dioxide surface and over the oxidized yttrium or oxidized scandium; and removing the oxidized yttrium or oxidized scandium from the silicon dioxide surface to form one or more hydrophilic silicon dioxide surface region bounded by the material having the lower hydrophilicity than the silicon dioxide.

One embodiment of a field effect transistor includes: a source electrode: a drain electrode: a gate electrode; and a conducting channel in electrical contact with the source electrode and the drain electrode, the conducting channel comprising a film comprising aligned semiconducting single-walled carbon nanotubes. Some embodiments of the field effect transistor are characterized by a current density of at least 1.8 mA $\mu m^{-1}$ and a transconductance of at least 1.14 mS $\mu m^{-1}$, as measured at 0.6 V drain voltage.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

Figure 12A:
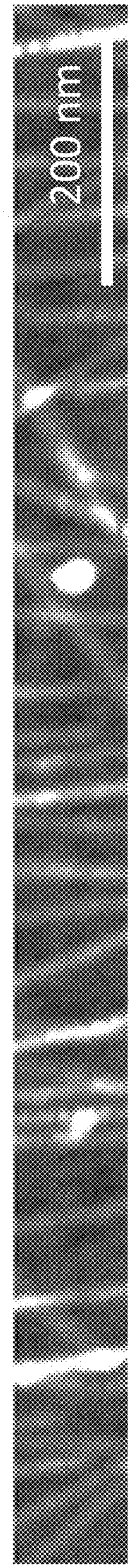
Figure 12B:
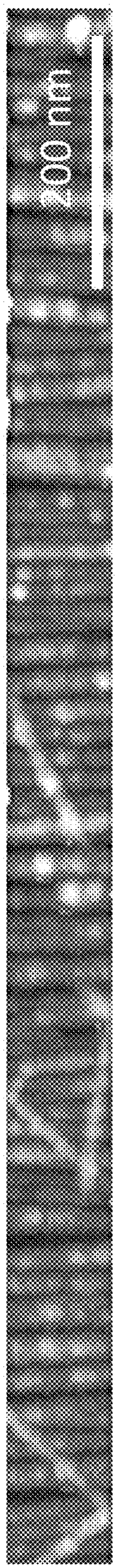

The images in FIGS. 12A and 12B are AFM height images showing representative s-SWCNT films in accordance with Example 2.

DETAILED DESCRIPTION

Methods of forming films of aligned elongated nanoparticles, films made using the methods, and electronic devices, such as transistors, that incorporate the films are provided. Also provided are methods of forming a patterned substrate for use in the film-forming methods.

In the methods, elongated nanoparticles, such as carbon nanotubes, floating at the surface of a liquid film are deposited onto a surface of a substrate as the liquid film dissipates on the surface. The alignment and deposition of the elongated nanoparticles occurs along a contact line that is defined either by the liquid film, the substrate, and a second liquid that is immiscible with the liquid film or by the liquid film, the substrate, and air. As the liquid film dissipates, the contact line recedes across the surface of the substrate and the elongated nanoparticles are deposited from the contact line onto the substrate surface in the form of a nanoparticle film.

The methods can produce large-area (e.g., wafer-scale) patterned films of elongated nanoparticles with exceptionally high nanoparticle alignment and linear packing densities in a continuous and scalable process. The degree of alignment of the elongated nanoparticles in the deposited films refers to their degree of alignment along their long axes within the film, which can be quantified using the methods described in the Example. In some embodiments, the deposited films have an elongated nanoparticle mean degree of alignment of ±10° or better. (That is, the mean of the magnitude of misalignment for the elongated nanoparticles in the deposited film is no greater than 10°.) This includes elongated nanoparticle films in which the elongated nanoparticles have a mean degree of alignment of +6° or better.

The density of the elongated nanoparticles in the films can be measured by their linear packing density, which can be quantified in terms of the number of elongated nanoparticles per μm and measured as described in the Example. In some embodiments, the method described herein deposit films having an elongated nanoparticle linear packing density of at least 30 elongated nanoparticles/μm. This includes embodiments in which the films have an elongated nanoparticle linear packing density of at least 50 elongated nanoparticles/μm, at least 100 elongated nanoparticles/μm, and at least about 200 elongated nanoparticles/μm.

The high nanoparticle packing densities and degree of alignment that can be achieved using the methods render films made by the methods suitable for use in a variety of high-performance electronic applications, including as channel layers in FETs. The high density and degree of alignment that can be achieved in semiconducting single-walled carbon nanotube (s-SWCNT) films made using the present methods, enables the fabrication of FETs having a current density of at least 1.8 mA $\mu m^{-1}$ and a transconductance of at least 1.14 mS $\mu m^{-1}$ (measured at 0.6 V drain voltage). This includes FETs having a current density of up to 2.2 mA $\mu m^{-1}$ and a transconductance of up to 1.4 mS $\mu m^{-1}$, or even higher (measured at 0.6 V drain voltage).

More details regarding the fabrication and characterization of such high-performance FET are provided in the Example.

The methods are carried out on a substrate having a surface with at least one liquid film-adsorbing surface region, the boundaries of which are defined by one or more liquid film-repelling surface regions. The liquid film-adsorbing and liquid-film-repelling surface regions are characterized by a difference in their hydrophilicity, such that a liquid applied to the surface adsorbs to the liquid film-adsorbing regions, but not to the liquid film repelling regions. Depending upon the liquid being used, the liquid film-forming regions may by more hydrophilic than the liquid film-repelling regions or vice versa. For example, if the liquid films comprise an aqueous medium or comprise a hydrophilic organic solvent, the liquid film-adsorbing regions will be more hydrophilic than the liquid film-repelling regions. (For the purposes of this disclosure, the term "aqueous medium" refers to pure water, as well as aqueous solutions in which one or more solutes are dissolved in water and aqueous solutions that include one or more organic solvents as minority cosolvents. For example, solutes that depress the melting point of water or antibacterial agents may be dissolved in water to provide an aqueous medium.) However, if the liquid films comprise a hydrophobic organic solvent, the liquid film-adsorbing regions will be less hydrophilic than the liquid film-repelling regions. It should be noted that the description of the liquid film adsorbing and liquid film repelling regions as having "a difference in their hydrophilicity" does not imply that both regions are hydrophilic (i.e., having a water contact angle of 0° or greater). Rather, it is possible for both the liquid film-adsorbing and liquid film-repelling regions to be hydrophilic, for both the liquid film-adsorbing and liquid film-repelling regions to be hydrophobic (i.e., having a water contact angle of 0° or greater), for the liquid film-adsorbing regions to be hydrophilic and the liquid film-repelling regions to be hydrophobic, or for the liquid film-adsorbing regions to be hydrophobic and the liquid film-repelling regions to be hydrophilic. The key is that the difference in the hydrophilicities of the two regions be sufficiently different to allow for selective liquid film retention on the liquid film-adsorbing regions.

As used herein, a hydrophilic surface region is a surface region having a water contact angle of equal to or less than 90° and a hydrophobic surface region is a surface region having a water contact angle (WCA) of greater than 90°, as measured using the sessile drop method at the temperature at which film formation is being conducted. For film deposition at room temperature, this temperature would be ~23° C. For purposes of illustration only, in some embodiments of the methods both the liquid film-adsorbing and liquid film-repelling surface regions are hydrophilic by the above definition of hydrophilicity, but the liquid film-adsorbing regions are more hydrophilic. For example, a liquid film-adsorbing region can have a WCA of less than 10° and a liquid film-repelling region can have a WCA in the range from 25° to 60° or vice versa.

Figure 1:
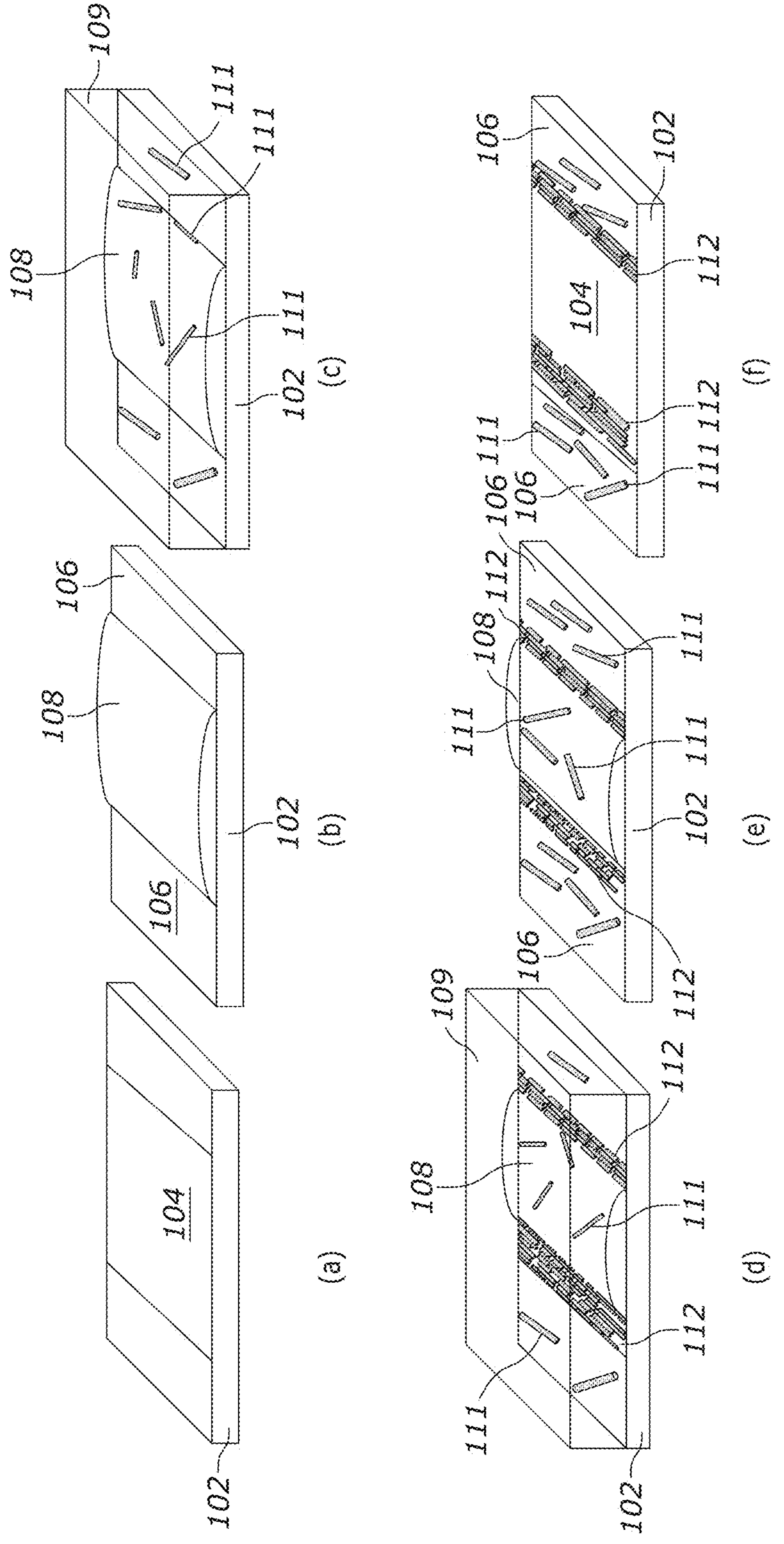
FIG. 1, panels (a)-(f) illustrate the formation of a high-density film of aligned elongated nanoparticles using surface-water-assisted deposition onto the floor of a flow channel.

One embodiment of a method of forming a film of aligned elongated nanoparticles is illustrated schematically in FIG. 1. The process begins with a substrate 102 having a surface with a liquid film-adsorbing surface region (here, a stripe) 104. Stripe 104 is bounded above and below by two liquid film-repelling regions 106.

A liquid film 108 is formed on each of the one or more liquid film-adsorbing surface regions 104 by contacting the substrate surface with liquid that adsorbs to the liquid film-adsorbing surface regions to form a liquid film thereon. The substrate surface may be contacted with the liquid by flowing the liquid over the substrate surface, by submerging the substrate in the liquid, by spraying the liquid onto the substrate surface, by printing the liquid onto the substate surface, or by other means. The liquid is selectively retained on the one or more liquid film-adsorbing surface regions, but not on the liquid film-repelling regions, such that the boundaries of liquid film-adsorbing surface regions are defined by the liquid film-repelling surface regions. This is illustrated in FIG. 1, panel (b), which shows a liquid film 108 immobilized on stripe 104 and bounded by liquid film repelling regions 106.

A suspension 109 of elongated nanoparticles 111 in a second liquid that is immiscible with the liquid of liquid film 108, referred to herein as a "nanoparticle ink." is then contacted with liquid film 108. A suspension can be contacted with a liquid film by flowing the suspension over the liquid film, forming a layer of the suspension over the liquid film, spraying the suspension onto the liquid film, inkjet printing the suspension onto the liquid film, or by other means. When immiscible suspension 109 is in contact with liquid film 108 an interface is formed between the suspension and the liquid film and some elongated nanoparticles 111 from suspension 109 are transferred to liquid film 108 where they "float" on top of liquid film 108 (FIG. 1, panel (c)). These floating elongated nanoparticles are free to move on liquid film 108 until they contact and are pinned at a contact line formed by liquid film 108, substrate 102, and either suspension 109 or air. As liquid film 108 dissipates and the contact line recedes across the liquid film-adsorbing region 104 elongated nanoparticles 111 pinned at the contact line become fixed on liquid film-adsorbing region 104 and are self-aligned along the contact line. Subsequently deposited elongated nanoparticles self-align to the previously deposited elongated nanoparticles as liquid film 108 continues to dissipate, resulting in the deposition of a densely packed film of highly aligned elongated nanoparticles 112 on substrate 102. Some elongated nanoparticles 111 may also be deposited onto liquid film-repelling surface regions 106. However, nanoparticles films formed on those regions will generally have a lower nanoparticle packing density and degree of alignment than the nanoparticle films deposited on liquid film-adsorbing region 104.

The elongated nanoparticles may be deposited onto the substrate in the presence of the immiscible suspension (i.e., while the suspension in contact with the liquid film), in which case the dissipation of the liquid films that form on the liquid film-adsorbing surface regions may be due to the dissolution of liquid into the immiscible liquid of the nanoparticle suspension. In this scenario, the elongated nanoparticles are deposited along a contact line formed by the liquid film, the substrate, and the suspension. Alternatively, the elongated nanoparticles may be deposited onto the substrate after the nanoparticle suspension is no longer in contact with the liquid films that form on the liquid film-adsorbing surface regions (e.g., after a flow of the suspension over the liquid films has stopped or after the liquid films have been extracted from the suspension), in which case the dissipation of the liquid films is due to the evaporation of liquid from the films and the elongated nanoparticles are deposited along a contact line formed by the liquid film, the substrate, and air. In some embodiments of the methods, the deposition of the elongated nanoparticles may occur both in the presence of the nanoparticle suspension (FIG. 1, panel (d)) and subsequently as the liquid film evaporates in air (FIG. 1, panel (e)). The film of aligned elongated nanoparticles 112 deposited along the receding contact lines is characterized by a high linear packing density and high elongated nanoparticle alignment (FIG. 1, panel (f)).

It should be noted that, the immiscible suspensions used in the methods need not be perfectly immiscible, as some degree of dissolution of the liquid of the liquid film in the suspension is permissible. Thus, an immiscible suspension need only be sufficiently immiscible to allow for nanoparticle film formation based on the principles described herein and on the timescale of the nanoparticle film deposition process.

The embodiment of the method shown in FIG. 1 illustrates how the methods can be carried out in a flow channel in which liquid film-adsorbing regions are patterned on one or more interior surfaces of the channel. The flow channel may be a closed channel or an open channel (i.e., a trench). In these methods, the liquid that forms the liquid films is flowed through the channel. After the flow of liquid is stopped, the films of the liquid are selectively retained on the liquid film-adsorbing surface regions. The elongated nanoparticle-containing suspension is then flowed through the channel, over the adsorbed liquid films, and the deposition of the elongated nanoparticles onto the surface proceeds as described above. In these embodiments of the methods, the aligned nanoparticle films will typically be deposited on the floor of the flow channel, but may also be deposited on other channels surfaces, such as the walls.

In other embodiments of the methods, one or more films of aligned elongated nanoparticles are deposited from a two-dimensional (2D) liquid/suspension interface formed between an adsorbed liquid film and an overlying water-immiscible suspension in which the elongated nanoparticles are suspended. In these embodiments, as a substrate patterned with one or more liquid film-adsorbing surface regions is translated across the liquid/suspension interface, some of the liquid is retained on the liquid-film adsorbing surface regions as those regions pass from the layer of the liquid into the layer of the suspension and then into the air. This method is illustrated schematically in FIG. 2A, which shows a cross-sectional view of a substrate 202 having a liquid film-adsorbing stripe (denoted as having a water contact angle (WCA)=0°) 204 bounded by upper and lower liquid film-repelling surface regions 206 (denoted as having a WCA=) 40°. Initially, stripe 204 is submerged in liquid 205, which forms an interface 207 with an overlying suspension 209 of elongated nanoparticles 211 (FIG. 2A, panel (a)). Liquid 205 and the liquid of suspension 209 are sufficiently immiscible that suspension 209 spreads on liquid 205 to form interface 207. As suspension 209 evaporates, additional suspension may be supplied continuously or intermittently to maintain interface 207 for the duration of the nanoparticle deposition process. In some embodiments of the methods, suspension 209 is continuously flowed over liquid 205 throughout the nanoparticle film deposition process, as discussed in conjunction with FIG. 2B, below.

Figure 2A:
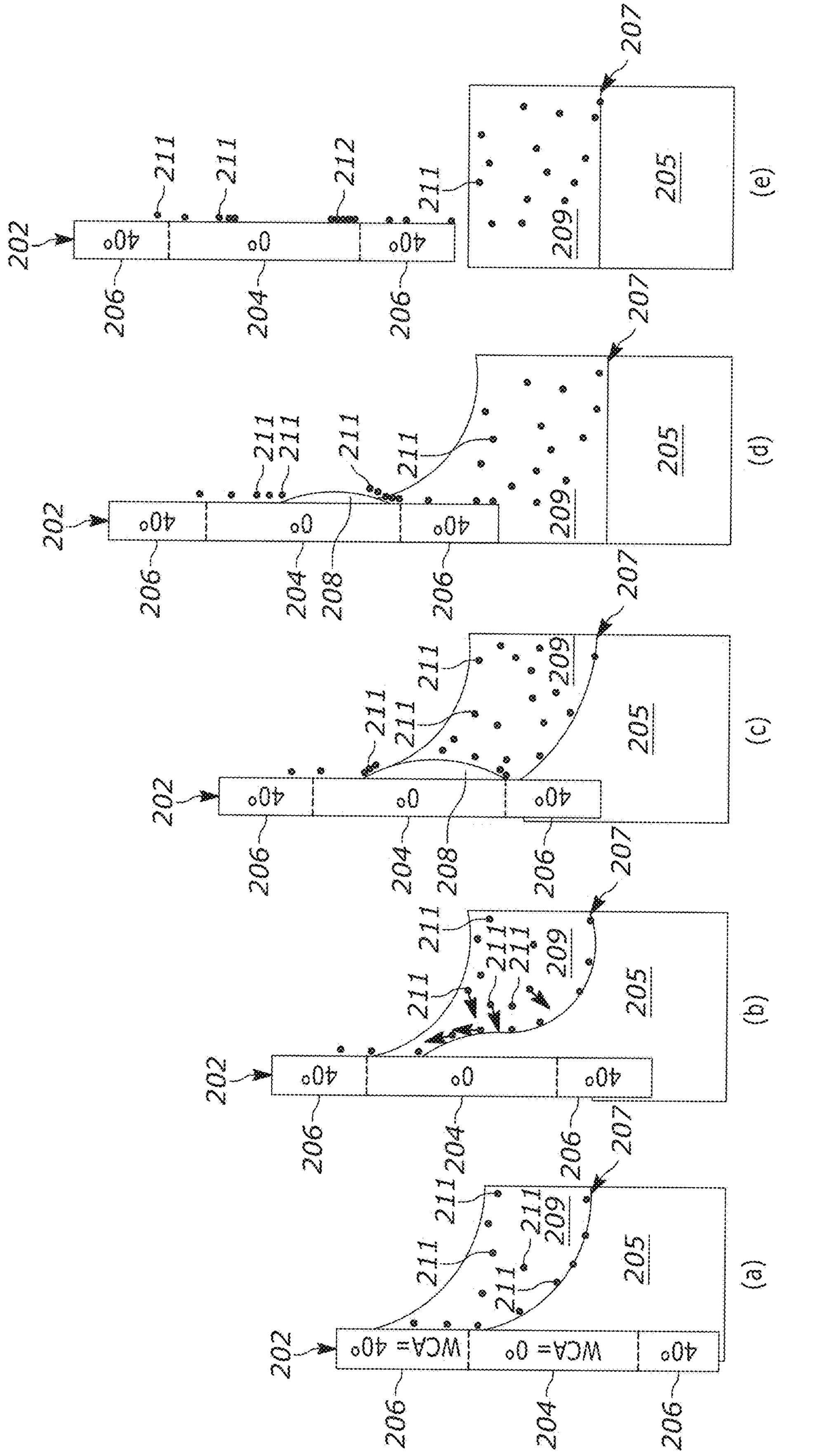
FIG. 2A, panels (a)-(e) illustrate the formation of a high-density film of aligned elongated nanoparticles from an interface between an aqueous medium and an immiscible organic solvent using surface-water-assisted deposition.

As substrate 202 is extracted from liquid 205 and through suspension 209, a liquid film 208 is retained and immobilized on liquid film-adsorbing stripe 204 (FIG. 2A, panels (b) and (c)) and some elongated nanoparticles 211 from suspension 209 are transferred to interface 207 where they "float" on the surface of liquid film 208. These floating elongated nanoparticles 211 become pinned and aligned at a contact line formed by the liquid film 208, substrate 202, and either suspension 209 or air. The pinned elongated nanoparticles are then deposited as an aligned nanoparticle film on substrate 202 as liquid film 208 dissipates, causing the contact line to recede across liquid film-adsorbing surface region 204.

The elongated nanoparticles in may be deposited onto the substrate while the liquid film is still submerged in the suspension, in which case the dissipation of the liquid film may be due to the dissolution of liquid into the suspension, and the elongated nanoparticles are deposited along a contact line formed by the liquid, the substrate, and the suspension. Alternatively, as shown in FIG. 2A, elongated nanoparticles 211 may be deposited onto substrate 202 after liquid film 208 is fully extracted from suspension 209, in which case the dissipation of the liquid film is due to the evaporation of liquid into the air and the elongated nanoparticles are deposited along a contact line formed by liquid film 208, substrate 202, and the air (FIG. 2A, panel (d)). In some embodiments of the methods, the deposition of the elongated nanoparticles onto a substrate may occur as the liquid film dissipates due to dissolution while the liquid film is still submerged in the suspension and also as the liquid film dissipates by evaporation after the liquid film has been fully extracted from the suspension. The film of aligned elongated nanoparticles deposited along the receding contact lines is characterized by a high linear packing density and high elongated nanoparticle alignment (FIG. 2A, panel (e)).

Figure 2B:
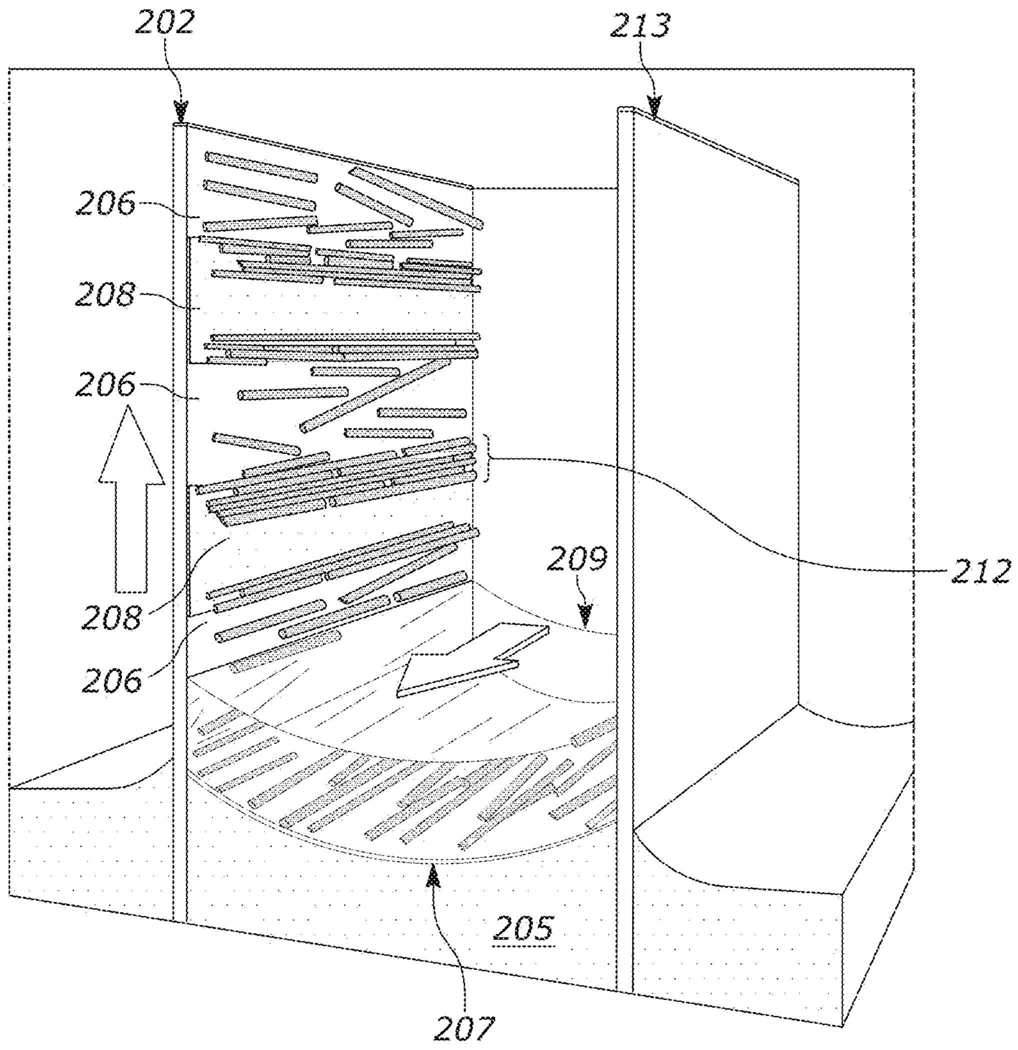
FIG. 2B illustrates the formation of a high-density film of aligned elongated nanoparticles using surface-water-assisted tangential flow interfacial self-assembly (TaFISA) deposition.

FIG. 2B illustrates an embodiment of the method depicted in FIG. 2A in which immiscible suspension 209 is continuously flowed over liquid 205 while an elongated nanoparticle film 212 is deposited onto liquid film-adsorbing surface regions 204 of substrate 202. Interface 207 is formed by flowing suspension 209 tangentially over the surface of liquid 205 within a flow channel. Because these methods use tangential flow and nanoparticle self-assembly at a contact line, the methods are referred to as Tangential Flow Interfacial Self-Assembly ("TaFISA"). The width of the flow channel is defined by substrate 202 and a confining wall 213 disposed opposite substrate 202 and separated from substrate 202 by a gap. Substrate 202 and confining wall 213 are immersed in liquid 205. During the deposition of elongated nanoparticle film 212 onto substrate 202, suspension 209 flows between substrate 202 and confining wall 213 and over liquid 205 as substrate 202 is translated across interface 207. The flow direction of suspension 209 is indicated by an arrow in the figure. Translating substrate 202 across interface 207 may be achieved by moving substrate 202 relative to interface 207 (i.e., by extracting substrate 202 from liquid 205 and suspension 209) or by changing the position of interface 207 relative to substrate 202 (i.e., by increasing the decreasing the level of liquid 205 in the flow channel). In the embodiment of the method shown in FIGS. 2B, substrate 202 and barrier wall 213 are oriented vertically and parallel. However, substrate 202 and barrier wall 213 need not be arranged with a parallel orientation and one or both of substrate 202 and barrier wall 213 can be tilted off-vertical.

Figure 2C:
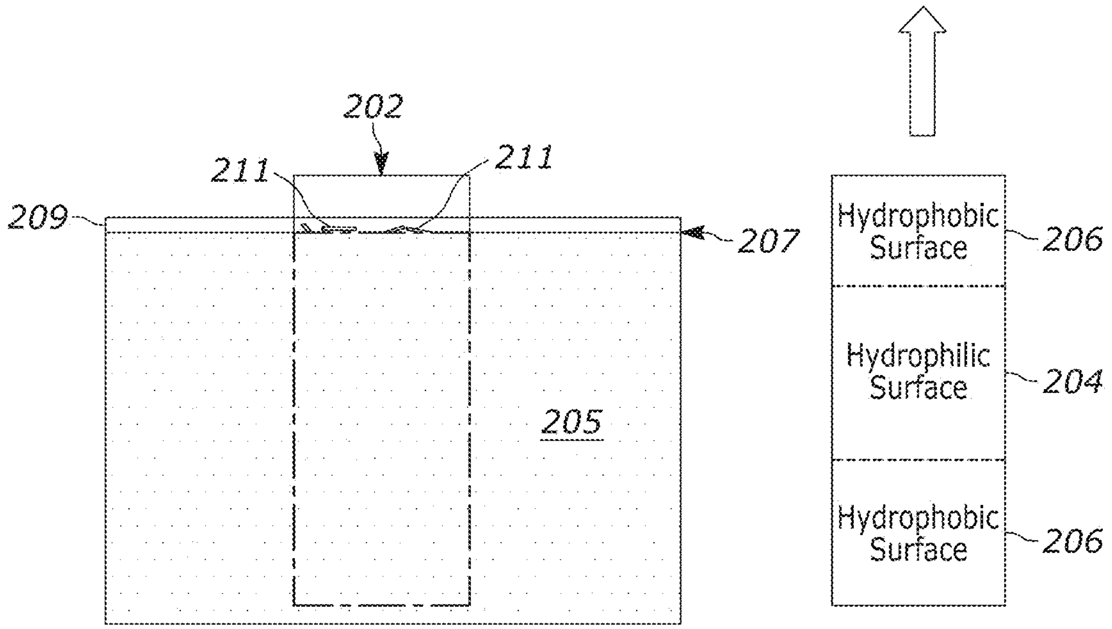
FIGS. 2C-2H illustrate the stages of nanoparticle film deposition during the surface-water-assisted TaFISA method. For simplicity, the elongated nanoparticles floating on the water in FIGS. 2A and 2B are shown as dots as if they are aligned normal to the image. However, elongated nanotubes in the nanoparticle ink and floating on the water are mobile and could have other orientations.
Figure 2D:
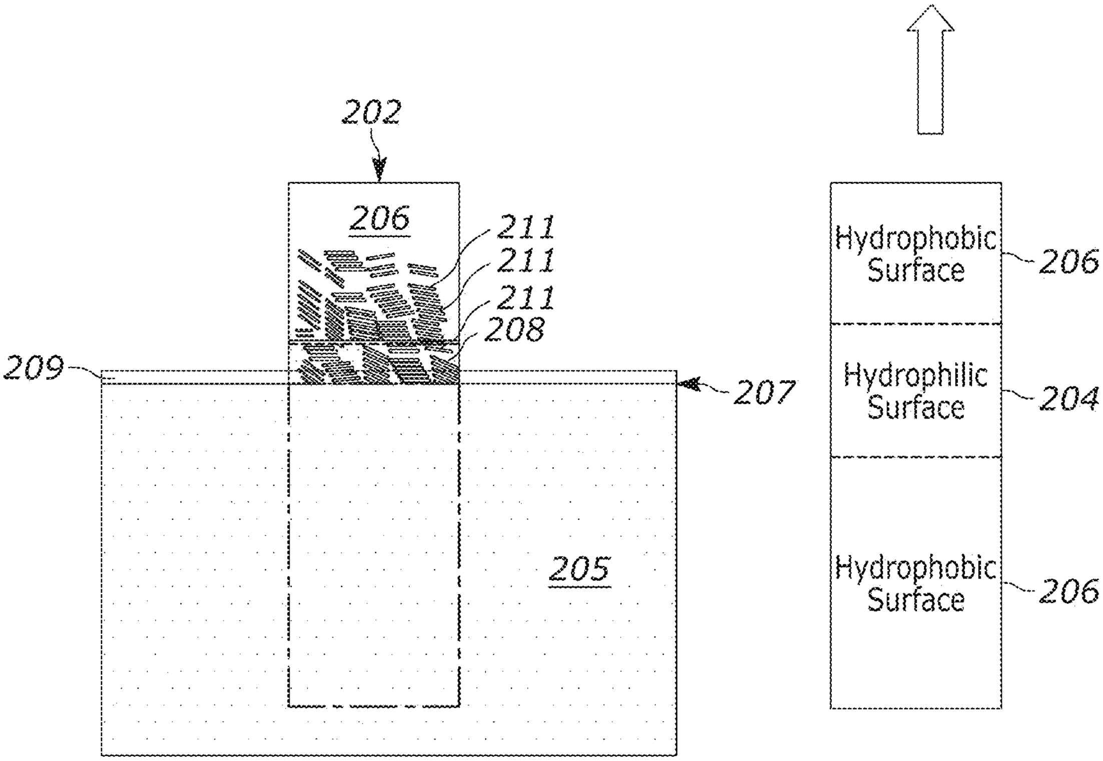
Figure 2E:
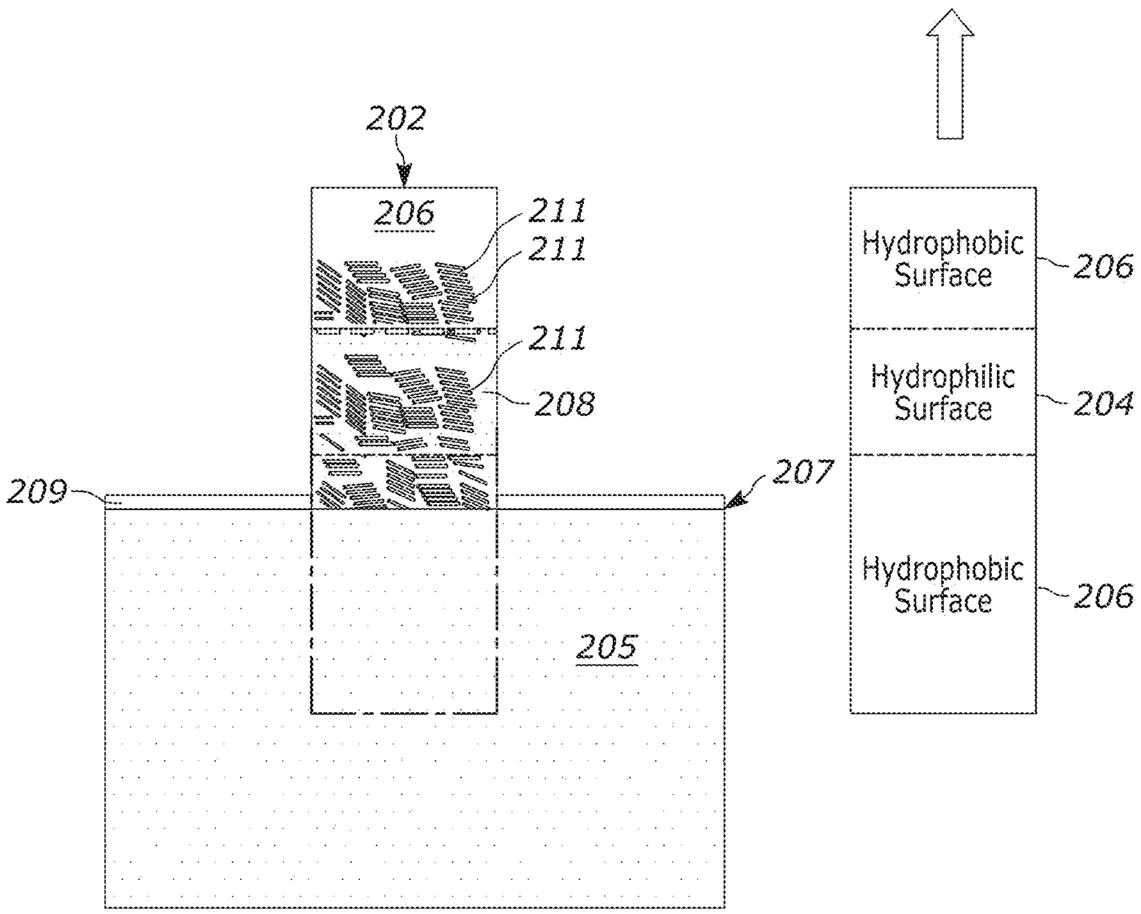
Figure 2F:
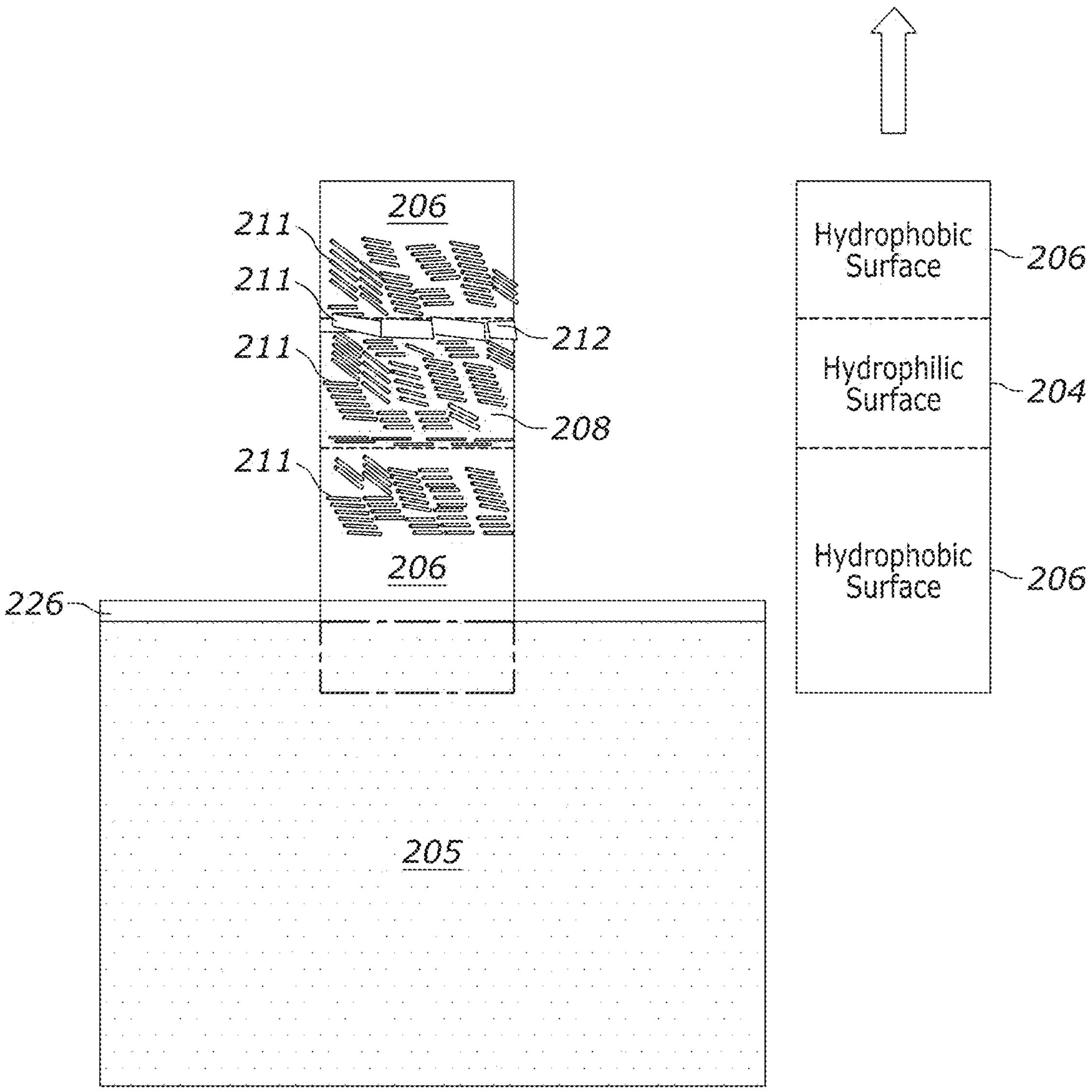
Figure 2H:
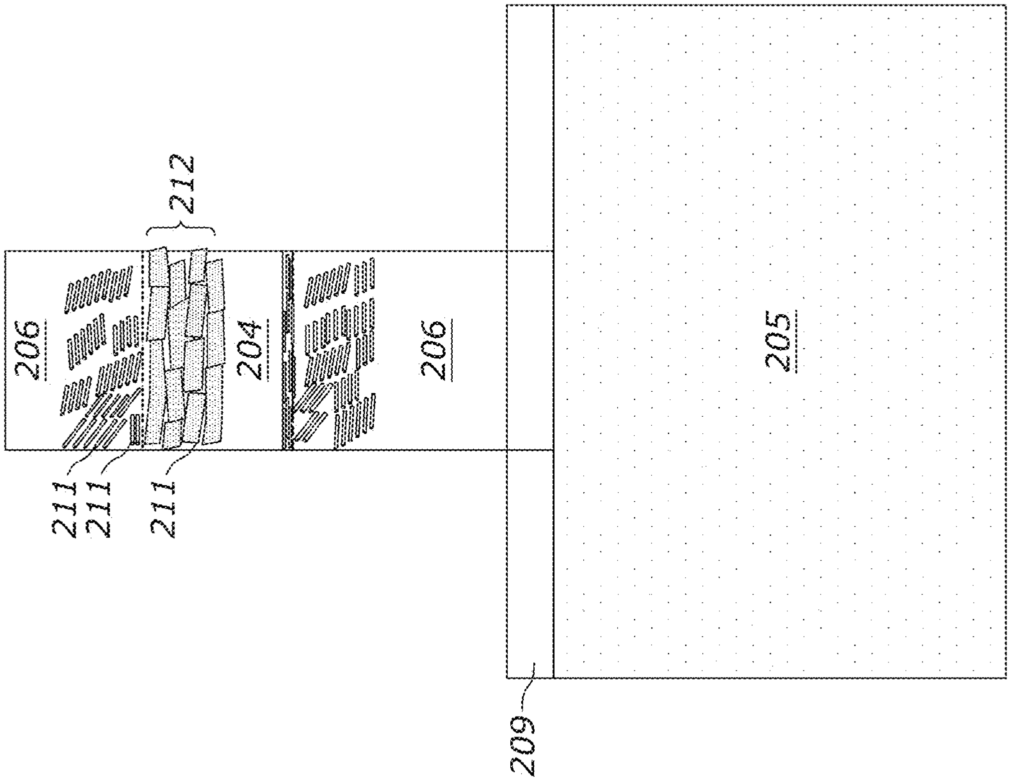
Figure 2G:
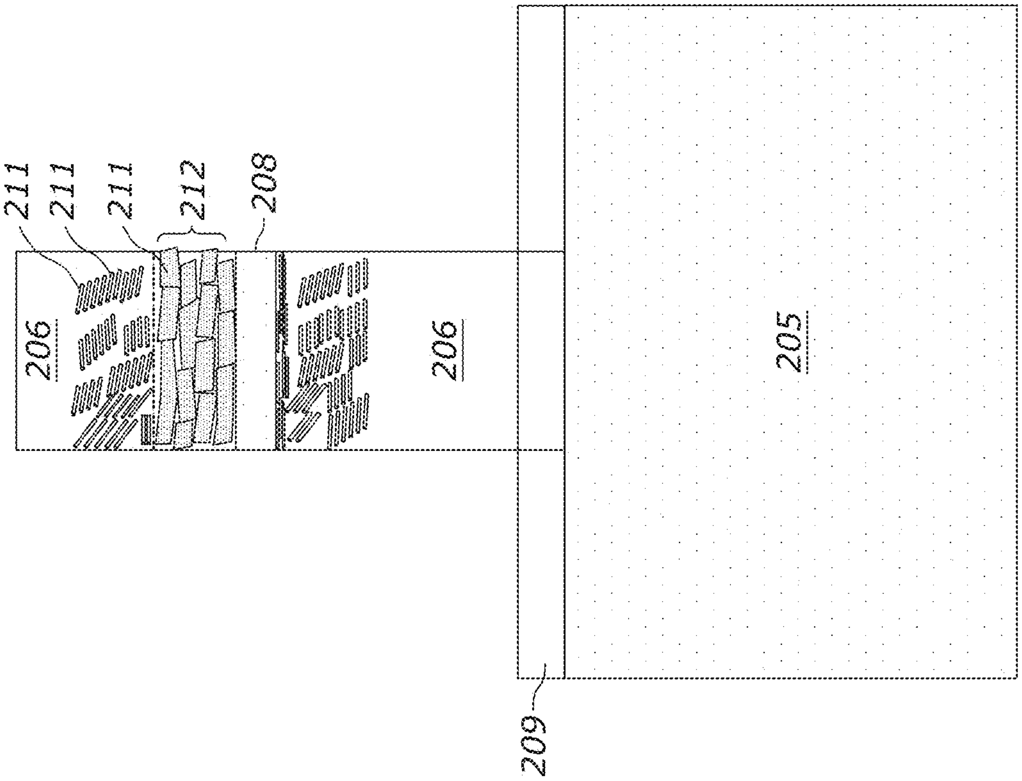

FIGS. 2C-2H illustrate the step-wise formation of an elongated nanoparticle film using the flow channel of FIG. 2B. In FIGS. 2C-2H, the flow direction is in the plane of the page from right to left. The submerged portion of the substrate is indicated with a dash-dot line and the positions of the liquid film-adsorbing and liquid film-repelling surface regions on the substrate in each step are shown in the panels to the right in the figures. Initially, liquid film-adsorbing surface region 204 is fully submerged in liquid 205 and flowing suspension 209. At this initial stage of the method, nanoparticles 211 from interface 207 may deposit on upper liquid film-repelling surface region 206 due to hydrophobic-hydrophobic interactions (FIG. 2C). As liquid film-adsorbing region 204 is extracted from liquid 205 and through flowing suspension 209 (FIG. 2D), liquid films 208 are retained on liquid film-adsorbing surface regions 204. Elongated nanoparticles 211 transferred from suspension 209 to liquid film 208, where they float at the surface of the liquid. A contact line is formed at the leading edge of liquid film-adsorbing surface region 204, liquid film 208, and air as liquid film-adsorbing surface region 204 moves out of flowing suspension 209. When liquid film-adsorbing surface region 204 emerges from flowing suspension 209, a second contact line is formed at the trailing edge of liquid film-adsorbing surface region 204, liquid 208, and air and nanoparticles 211 from interface 207 may deposit on lower liquid film-adsorbing surface region 206 due to hydrophobic-hydrophobic interactions (FIG. 2E). Elongated nanoparticles 211 floating on liquid film 208 condense and are deposited onto substrate 202 at the contact lines. As liquid film 208 evaporates, it recedes and, as a result, the contact lines move inward across liquid film-adsorbing surface region 204 and a film of aligned elongated nanoparticles 212 is deposited across substrate 202 (FIG. 2F). The extraction of substrate 202 from aqueous medium 205 and suspension 209 can continue until all hydrophilic surface regions have passed out of suspension 209. To discontinue nanoparticle film deposition, flowing suspension 209 can be replaced with a water-immiscible solvent 226 that is free of the nanoparticles. As aqueous film 208 continues to evaporate, the film of elongated nanoparticles 212 continues to grow (FIG. 2G). In this manner, films of elongated nanoparticles can be formed over a large area in a short time. By way of illustration, a liquid film retained on a liquid film-adsorbing surface region may completely evaporate within a few seconds or less (e.g., 10) seconds or less). The film of aligned elongated nanoparticles 212 may cover the entire liquid film-adsorbing region surface area or, if the concentration of nanoparticles in the suspension is insufficient to provide complete coverage, a bare patch may remain on liquid film-adsorbing surface region 204 (FIG. 2H).

The elongated nanoparticles films can be formed from a variety of elongated nanoparticles, where elongated nanoparticles are characterized by high aspect ratios and nanoscale diameters. For the purposes of this disclosure, a high aspect ratio is defined as a length to diameter ratio of at least 5, including aspect ratios of at least 10, and a nanoscale diameter is defined as a diameter of no greater than 1000 nm, including diameters of no greater than 100 nm, no greater than 10 nm and no greater than 1 nm. Elongated nanoparticles include carbon nanoparticles, metal nanoparticles, and semiconducting nanoparticles, such as single-walled carbon nanotubes (SWCNTs), including both semiconducting SWCNTs (s-SWCNTs) and metallic SWCNTs (m-SWCNTs), multi-walled carbon nanotubes (MWCNTs), other types of single wall and/or multiwall nanotubes such as but not limited to boron nitride nanotubes, graphene nanoribbons, cellulose nanofibers (CNFs) and cellulose nanocrystals, metal nanowires (NWs), semiconducting nanowires such as Si or ZnO nanowires, ceramic nanowires, and nanowires made from organic materials.

The suspensions of the elongated nanoparticles are formed by dispersing the nanoparticles in a liquid. The liquid from which the suspension if formed will depend on the nanoparticles being used and may be an aqueous medium or an organic medium. A wide variety of liquids and mixtures of organic liquids may be used to form the liquid films and the suspension, provided that the liquid used to form the suspension is immiscible with the liquid used to form the liquid films. In some embodiments of the methods, the liquid film is an aqueous medium and the suspension is a non-aqueous organic liquid, or vice versa. Examples of suitable organic liquids include chloroform, toluene, 1,2-dichlorobenzene, carbon tetrachloride, cyclohexane, 1,2-dichloroethane, 1,1,2-trichloroethane, dichloromethane, chlorobenzene, 3-chlorotoluene, o-xylene, m-xylene, p-xylene, and mixtures of two or more thereof.

If the elongated nanoparticles are not sufficiently dispersible in a chosen aqueous medium or non-aqueous organic liquid, the nanoparticles may be surface-treated and/or coated with a material that renders the nanoparticles sufficiently dispersible. For example, s-SWCNTs may be coated in a coating that was used in a pre-sorting step to isolate s-SWCNTs from a mixture of s-SWCNTs and m-SWCNTs. These types of coatings are referred to herein as semiconductor-selective coatings. A number of semiconductor-selective coatings are known, including semiconductor-selective polymer coatings. Descriptions of such polymers can be found, for example, in Nish, A.: Hwang, J. Y.: Doig, J.: Nicholas, R. J. Highly selective dispersion of single-walled carbon nanotubes using aromatic polymers. Nat. Nanotechnol. 2007, 2, 640-6. The semiconductor-selective polymers are typically organic polymers with a high degree of π-conjugation and include polyfluorene derivatives, such as poly (9,9-dialkyl-fluorene) derivatives, and poly(phenyl vinylene) derivatives. Optionally, the coatings can be removed from the elongated nanoparticles after the nanoparticle films have been deposited.

The concentration elongated nanoparticles in the suspension will depend on the type of nanoparticles being used and the size of the surface area to be covered. Generally, at lower nanoparticle concentrations, less substrate surface area is covered. Substrate surface area coverage increases with increasing nanoparticle concentration in the suspension. At sufficiently high nanoparticle concentrations, the elongated nanoparticles at the liquid/suspension interface can interact and form two-dimensional liquid crystals floating at the surface of the liquid. These floating liquid crystals can then be deposited onto a liquid film-adsorbing surface region as the liquid film dissipates and the contact line recedes across the substrate. By way of illustration, the elongated nanoparticle concentration (e.g., the s-SWCNT concentration) in the suspensions can be in the range from 5 μg/mL to 200 μg/ml. However, lower or higher nanoparticle concentrations can be used.

The substrates upon which the elongated nanoparticle films are deposited may be hydrophilic or hydrophobic substrates. Examples of hydrophilic substrates include silicon and silicon oxide (e.g., $SiO_2$). Other hydrophilic substrate materials that can be used include metal oxides (including, but not limited to, aluminum oxide, hafnium oxide, and lanthanum oxide), silicon nitride, hydrophilic semiconductor materials, such as germanium, and organic materials such as hydrophilic polymers or polymers with grafted or crosslinked materials with hydrophilic functional groups such as poly(ethylene glycol) or zwitterions, on their surfaces. Hydrophobic substrate materials include substrates coated or functionalized with hydrophobic chemical functionalities or coatings, such as HMDS and hydrophobic organic polymers, including those that can be used in flexible electronics applications. Such polymers include, but are not limited to, polydimethylsiloxane (PDMS), polyethersulfone, poly(ethylene terephthalate), and the like. These materials may compose the deposition substrate or may be applied as coatings over a bulk substrate base. The liquid film-adsorbing and/or liquid film-repelling regions can be patterned onto a substrate surface using known methods, such as surface treatment or the deposition of patterned coatings.

In embodiments of the methods that use a barrier wall to define a flow channel (e.g., FIG. 2B), the barrier wall material is desirably, but not necessarily, selected such that the elongated nanoparticles adhere less readily to the surface of the barrier wall than to the surface of the deposition substrate. It is not necessary to eliminate the deposition of nanoparticles on the barrier wall. However, if deposition of the nanoparticles on the barrier wall is significant, it may be desirable to periodically replace the barrier wall or to clear the barrier wall of the deposited nanoparticles.

The liquid film-adsorbing surface regions can be various shapes and sizes. Because the elongated nanoparticles are deposited along contact lines having contours defined by the borders of the liquid film-adsorbing surface regions, the deposited elongated nanoparticle films will reflect the shape of the liquid film-adsorbing regions. This enables the deposition of elongated nanoparticle films having complex shapes and varied dimensions. By way of illustration, the liquid film-adsorbing surface regions and the nanoparticle films deposited thereon may have a square or rectangular shape, may form a straight line, may have a curved edge (e.g., circular or ovoid), or may form a line with sharp bends and/or rounded corners.

The nanoparticle films can be deposited as highly uniform, monolayer films over large surface areas. The area over which the uniform nanoparticle films can be formed is not particularly limited and can be sufficiently large to cover the surface of an entire semiconductor wafer. By way of illustration, elongated nanoparticle films can be deposited over surface areas of at least 1 $mm^2$, at least 10 $mm^2$, at least 100 $mm^2$, or at least 1 $m^2$.

Figure 3:
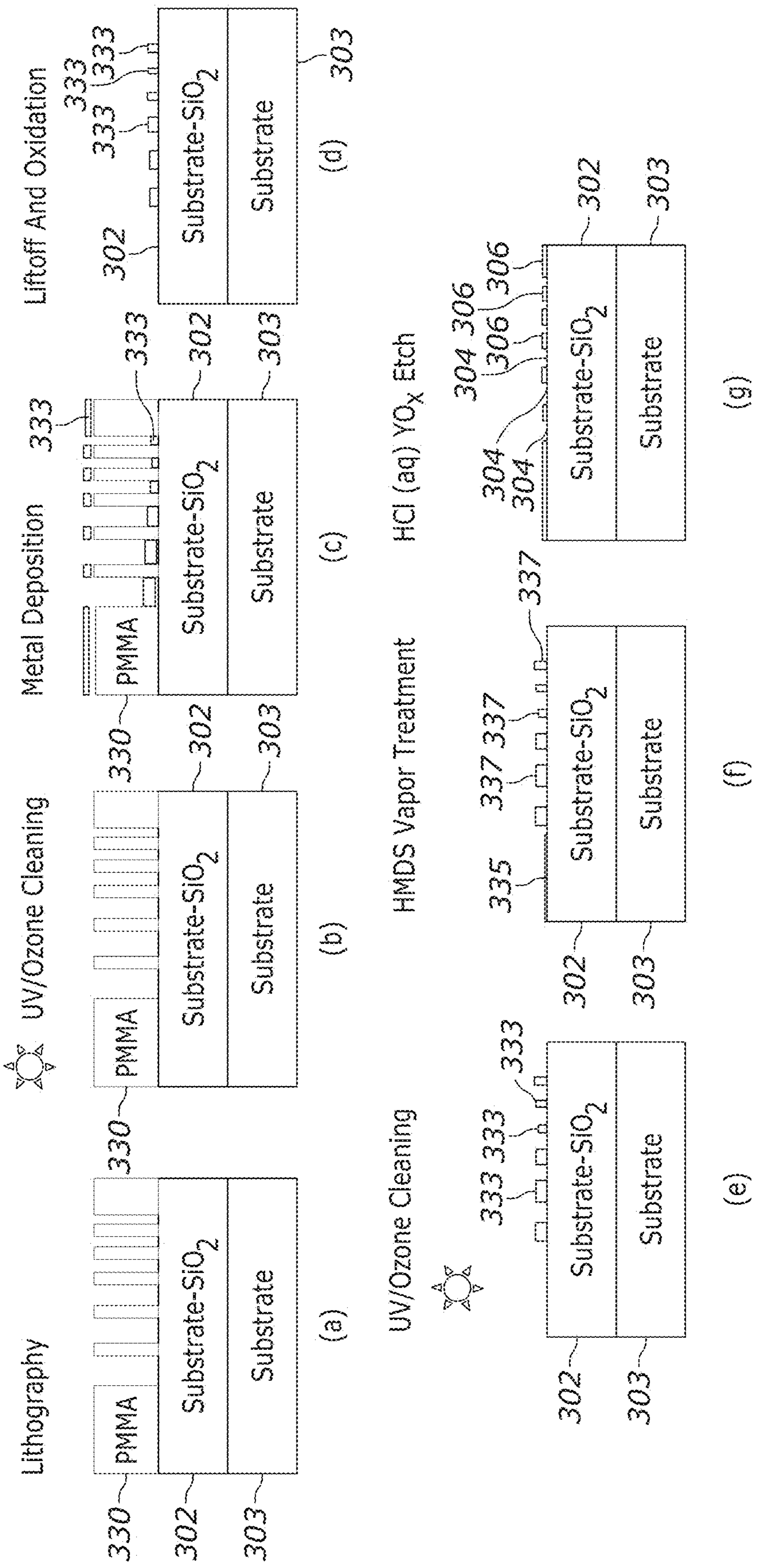
FIG. 3, panels (a)-(g), shows a process flow to form patterned hydrophobic and hydrophilic surface regions on a hydrophilic $SiO_2$ surface.

Conventional methods of patterning substrate surfaces with liquid film-adsorbing and liquid film-repelling surface regions, such as lithography, can be used. A novel method of forming a deposition substrate 302 having liquid film-adsorbing and liquid film-repelling surface regions starting with a silicon oxide ($SiO_2$) substrate 302 is depicted schematically in FIG. 3. In the embodiment of the method shown in FIG. 3, the $SiO_2$ surface is disposed on an underlying silicon substrate 303. The process begins by depositing a layer of positive resist 330, such as an electron-beam or photoresist, on $SiO_2$ substrate 302 and developing and lithographically patterning the resist to expose one or more regions of the underlying $SiO_2$ substrate surface. (FIG. 3, panel (a)). PMMA is used as resist 330 in the method shown in FIG. 3, but other resist materials can be used. Layer of resist 330 is then, optionally, cleaned using an ultraviolet (UV)/ozone exposure (FIG. 3, panel (b)). A thin layer of yttrium or scandium metal 333 is then deposited over patterned resist layer 330 and the exposed surface regions of $SiO_2$ substrate 302 (FIG. 3, panel (c)). Next, resist lift off removes resist layer 330, leaving yttrium or scandium metal 333 on the regions of $SiO_2$ substrate 302 that had been exposed through patterned resist layer 330 (FIG. 3, panel (d)). The sample is then exposed to an oxygen-containing atmosphere at a temperature and for a time sufficient to oxidize yttrium or scandium metal 333 and to increase the extent of $SiO_2$ surface oxidation (FIG. 3, panel (e)). By way of illustration only, the sample may be exposed to ozone and ultraviolet light at a temperature of at least 60° C. (for example, from 60° C. to 100° C.) for a time of at least 5 minutes (for example, from 5 to 20 minutes). A hydrophobic polymer or molecule-based coating 335, such as an HMDS coating, is then deposited over the exposed surface regions of $SiO_2$ substrate 302 and the oxidized yttrium or scandium 337 (FIG. 3, panel (f)). Oxidized yttrium or oxidized scandium 337 is then selectively etched to form a deposition surface comprising one or more hydrophilic $SiO_2$ surface regions 304 and one or more hydrophobic regions 306.

EXAMPLES

Example 1: Surface Water-Assisted TaFISA

This Example demonstrates methods of using thin films of water on a chemically patterned surface to direct s-SWCNTs into high density films in which the s-SWCNTs are aligned along a solvent-water-substrate or air-water-substrate contact line. To demonstrate this process, narrow hydrophilic stripes on $Si/SiO_2$ wafers were used as water film-adsorbing regions and narrow films of s-SWCNTs were deposited near the edges of patterned hydrophilic stripes (FIG. 4, panels (a)-(d)). The proposed film formation mechanism is substantiated by the following evidence from this example: first, the substrates selectively retain surface water on the hydrophilic surface regions during the deposition: second, the s-SWCNTs can be fixed in place on the substrate at a contact line: third s-SWCNTs are not deposited on the interior of the hydrophilic surface that contains water; and fourth, the presence of water allows the s-SWCNTs to self-align with previously deposited s-SWCNTs in a monolayer and form very closely packed films with very uniform alignment that have packing densities of up to 250 s-SWCNTs $\mu m^{-1}$. Field effect transistors using these films as semiconductor channel material were fabricated to demonstrate the high current density and transconductance enabled by such densely packed films.

Figure 4:
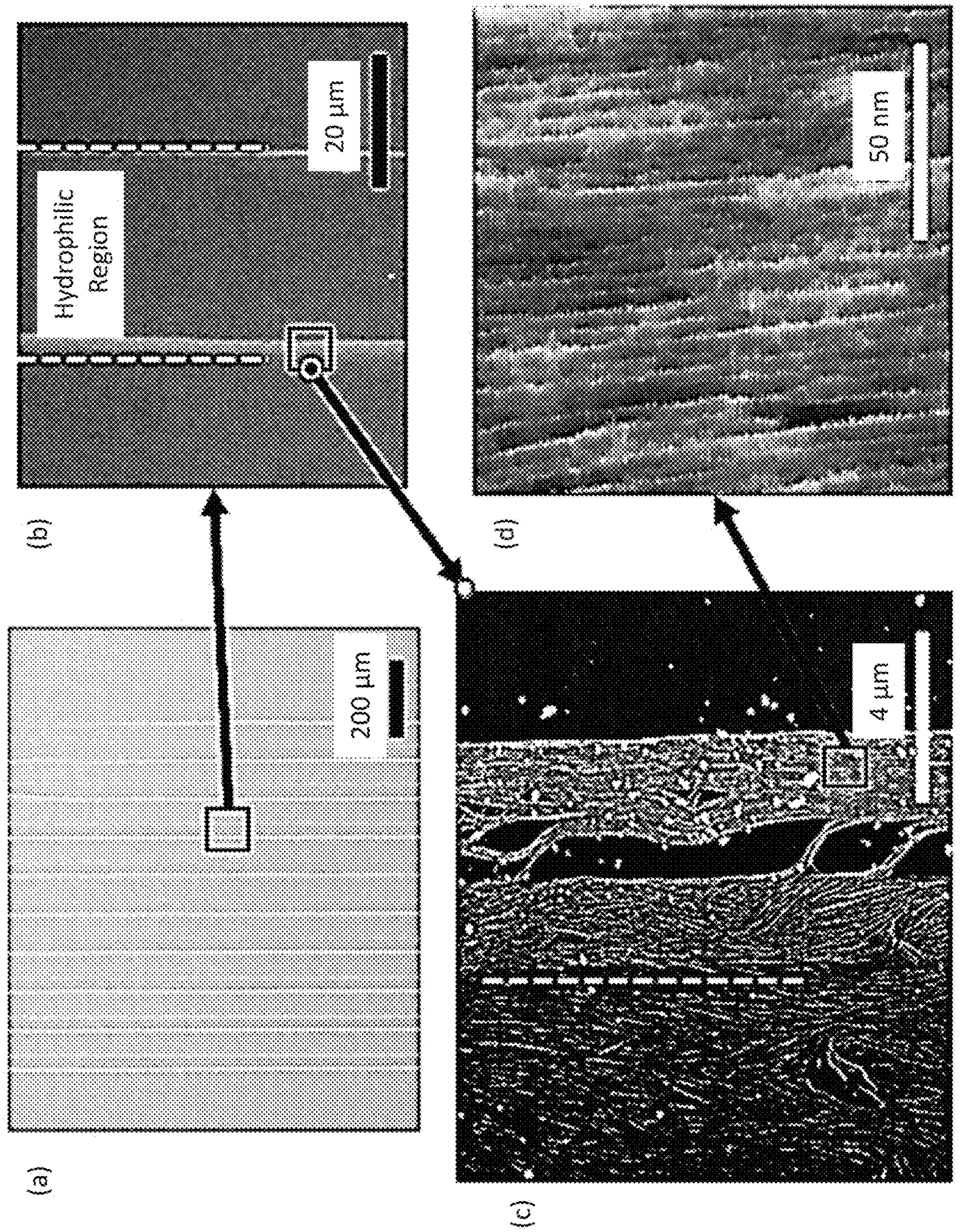
FIGS. 4, panels (a)-(d) shown high resolution atomic force microscopy (AFM) height images of ~50 μm-wide stripes of semiconducting single-walled carbon nanotube films formed as on hydrophilic regions of a substrate using a TaFISA based process at increasing magnification, as described in the Example.

Films Formed with Low s-SWCNT Concentration:

The sample in FIG. 4, panels (a)-(d) was patterned to have 50 μm wide hydrophilic stripes with a water contact angle (WCA) of <10° surrounded by a less hydrophilic surface with a WCA of 40°. This surface chemistry pattern was formed by lithographically depositing yttrium metal in the desired hydrophilic regions, using UV/ozone treatment to clean and hydroxylate the whole substrate and also to oxidize the yttrium metal, functionalizing the surfaces with HMDS to produce the less hydrophilic surfaces, and then etching the oxidized yttrium with a 5 second exposure to dilute aqueous hydrochloric acid to reveal a hydrophilic surface where the yttrium oxide had been while preserving the HMDS functionalized surface in all other regions (FIG. 3, panels (a)-(g)). The s-SWCNT films were deposited using a variant of the TaFISA process which is described in detail elsewhere. (K. R. Jinkins, Aligned 2D carbon nanotube liquid crystals for wafer-scale electronics, Science Advances. 2021. Vol. 7. Issue 37.) Briefly, as shown in FIG. 2A, the patterned substrate and a barrier wall were held parallel to each other to form a narrow flow channel between them and were immersed in a deionized (DI) water bath. A suspension of polymer wrapped semiconducting s-SWCNTs in chloroform (a s-SWCNT ink) was injected into the channel between the substrates and flowed along the surface of the water while the substrates were lifted through the ink-water interface. The s-SWCNT deposition took place as the substrate passed through the interface. In the liquid film-repelling HMDS surface regions, the s-SWCNTs were deposited as a uniform film aligned with the direction of the ink-water-substrate contact line. Since the s-SWCNT ink concentration was low (~5 μg $mL^{-1}$) the films in these regions were relatively sparse, having only 10-30 s-SWCNTs $\mu m^{-1}$. The s-SWCNT morphology on the hydrophilic stripes was very different. AFM was used to image these regions since it generates topographic images of the s-SWCNTs and can also indicate the different surface chemistries and show the border between the hydrophilic and the relatively hydrophobic (HMDS) regions (white dashed lines in FIG. 4, panels (b)-(c)). The center of the hydrophilic surface region was bare and had no s-SWCNTs. Inside and near the boundary of the hydrophilic region, the s-SWCNT films formed very uniform and high packing density films near the edges of the hydrophilic stripe. Between the surface chemistry boundary and the high packing density film was a region with one or more gaps in the film. Topographic imaging by AFM indicated all the s-SWCNTs in both the high packing density film and the less densely packed film had the same height from the substrate and were monolayers, with an occasional stray s-SWCNT that appeared to be on a second level. The s-SWCNTs in the high packing density films were not resolvable with typical AFM probes (2 to 10 nm tip radius) but can be resolved with specialized sharper probes (Tip radius ~1 nm) as shown in FIG. 4, panel (d). The high packing density films had a packing density of ~250 s-SWCNTs $\mu m^{-1}$.

Proposed Surface-Water-Assisted Film Deposition Mechanism:

The proposed mechanism by which these s-SWCNT films are formed is described above and shown schematically in FIG. 2A-2H. The images in FIGS. 2B-2H show how this mechanism operates during a TaFISA type deposition process and how the retained surface water stays on the substrate as it passes through the ink-water interface, then the ink-air interface, and eventually evaporates leaving a dry surface film. The black dots in FIG. 2B represent s-SWCNTs aligned parallel to the ink flow direction and perpendicular to the substrate surface; the black lines indicate s-SWCNTs with other orientations. For simplicity all the s-SWCNTs on interfaces are represented by aligned dots, though mobile s-SWCNTs on a water surface can have other orientations. Individual s-SWCNTs floating on the retained surface water migrate to and are deposited at the ink-retained water film-substrate contact line while s-SWCNTs that are deposited on the HMDS surface regions do not move after deposition. By observing specific parts of the deposition process, analyzing the s-SWCNT film morphology, and separate controlled experiments, the plausibility of the mechanism can be demonstrated. This is done by breaking down the mechanism into smaller parts that are more easily evaluated: retention of surface water as a film on hydrophilic surface regions, deposition of s-SWCNTs at the suspension-water-substrate contact line, mobility of s-SWCNTs on the water surface, and the self-alignment and close packing of s-SWCNTs in the presence of surface water.

The first part of the investigation confirms the retention of water on the hydrophilic surface regions of the substrate. Surface water in the hydrophilic surface regions was observable by eye during the preparation of the substrate after both the dilute aqueous HCl etching and the DI water rinsing. To confirm that surface water was retained even during the deposition conditions with the chloroform-based s-SWCNT ink flowing across the substrate surface, videos of the surface through transparent quartz substrates were collected, and the retention of water was clearly visible. In the videos, some chloroform solvent was also present on the substrate, though it evaporated quickly, within 1-2 seconds, while the water was retained for longer, up to 3-4 seconds.

The second part of this investigation confirmed that s-SWCNTs were deposited at liquid-liquid-solid contact lines formed by the retained water films on the surface, surrounded by the chloroform ink.

The third part of this investigation confirmed that s-SWCNTs deposited on the retained surface water films are mobile and do not pass through the surface water film to deposit on the interior of the hydrophilic region while the water is present. It was inferred that this must be the case by looking at the solubility of the s-SWCNTs, the properties of the hydrophilic surface regions in the presence of water, and the morphology of the deposited films. To start, polymer-wrapped s-SWCNTs used are not soluble in water, so when they diffused from the chloroform ink to the chloroform-bulk water interface, they stayed at that interface. The retained surface water films on the substrate could be thin enough to behave differently than bulk water. To check this, a surface with water-adsorbing and water-repelling surface regions was prepared, sparse s-SWCNTs were deposited on them directly from chloroform using no water via spin coating, and then the samples were dipped in water. Before the water exposure, the s-SWCNTs were randomly distributed on the whole surface on both the water-adsorbing hydrophilic and water-repelling, less hydrophilic (relatively hydrophobic) regions. After the water exposure, all the s-SWCNTs on the water-adsorbing hydrophilic surface regions were gone, and all those on the relatively hydrophobic surfaces remained in place. The ability to remove s-SWCNTs with a simple water rinse demonstrates that any s-SWCNT that managed to penetrate the retained water film would not adhere to the hydrophilic surface and would diffuse back to the ink-water film interface or the ink-water film-substrate contact line. When the experiment was repeated with a high packing density of randomly oriented s-SWCNTs that formed an interconnected network, most of the s-SWCNTs on the hydrophilic surface regions were not removed by a simple water rinse, which implies that the adhesion forces between neighboring s-SWCNTs can stabilize the location of deposited s-SWCNTs.

Next, the morphology of the deposited films on the water-repelling region and on the water-adsorbing region was studied (FIG. 4, panels (a)-(d)). Those images are from two regions on the same substrate from a single deposition process. The relatively hydrophobic water-repelling surface region had a relatively uniform deposition of s-SWCNTs in a film with ~20 s-SWCNTs $\mu m^{-1}$, while the hydrophilic striped surface regions only had s-SWCNTs at the edges of the stripe with bare regions in the interior of the stripe. Based on the uniform s-SWCNT density in the relatively hydrophobic region, it was inferred that the solvent-water interface of the retained surface water started with a uniform distribution of s-SWCNTs. If the s-SWCNTs remained in place while the water was evaporating, then they would be transferred to the substrate in a similar uniform distribution, but all the deposited s-SWCNTs were found near the edges of the stripes. Based on this, it can be inferred that the s-SWCNTs that were initially uniformly distributed across the surface of the retained water films were able to migrate to the edges of the water stripes before the water evaporated.

Figure 5A:
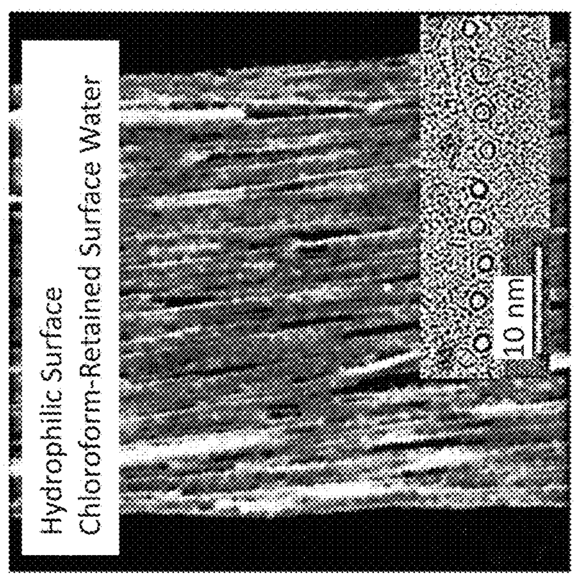
FIGS. 5A-5D show high resolution AFM height images of semiconducting single-walled carbon nanotube films formed using the TaFISA based process on hydrophilic stripes (FIG. 5A) and on uniform hydrophobic regions (FIG. 5B) with corresponding histograms (FIGS. 5C, 5D) of the alignment angle of the visible semiconducting single-walled carbon nanotube segments.
Figure 5B:
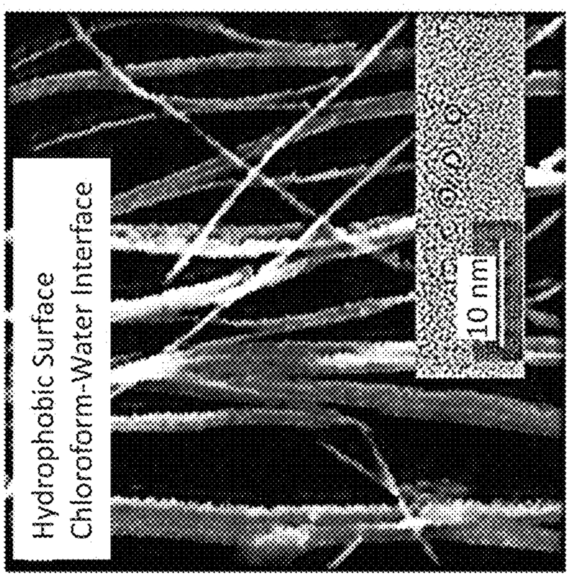
Figure 5C:
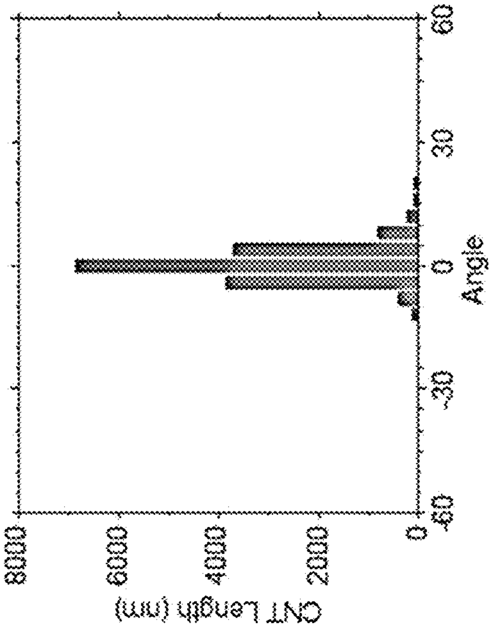
Figure 5D:
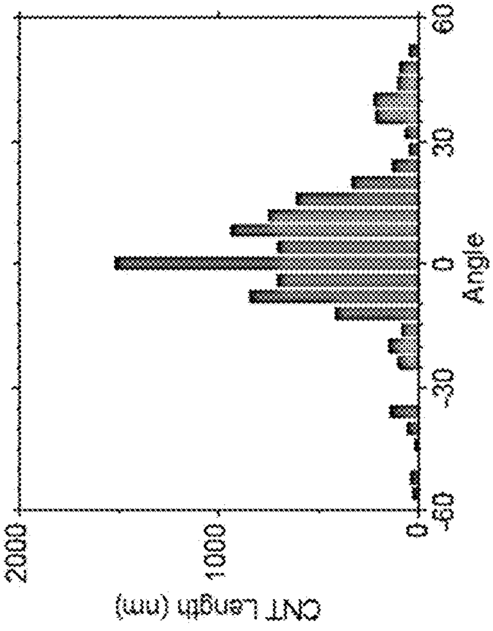

The final part in this investigation confirmed the self-alignment of the s-SWCNTs in the hydrophilic surface regions into s-SWCNT films that are more closely packed compared to the less closely packed s-SWCNT films deposited onto the relatively hydrophobic surface regions. In this Example, high-resolution AFM imaging with very sharp probes having a tip radius close to 1 nm was used to examine the s-SWCNT films. With the high-resolution probes and very careful imaging conditions, individual s-SWCNTs that have a pitch of 3.5 to 4 nm can be resolved. It was observed that the high packing density films near the borders of the hydrophilic surface regions (FIG. 5A and corresponding histogram in FIG. 5C) had a packing density that was ~250 s-SWCNTs $\mu m^{-1}$ and a relatively uniform height from the substrate of ~3 nm. In the films formed in the uniform relatively hydrophobic surface regions (FIG. 5B and corresponding histogram in FIG. 5D), the s-SWCNTs were arranged in strands of ~1 to 10 s-SWCNTs arranged in an interconnected film via a Y-branching pattern where, for example, a strand with 5 s-SWCNTs will have two s-SWCNTs that separate from the original strand and merge with the neighboring strand. Within each strand, the s-SWCNTs were also closely packed at ~250 s-SWCNTs $\mu m^{-1}$. Films of both types were also imaged with cross-section transmission electron microscopy (TEM), which confirmed the high-resolution AFM images were showing monolayers with mean pitches of 3.5 and 3.4 nm for the films on both hydrophilic and relatively hydrophobic regions (Insets in FIGS. 5A and 5B). Almost all the strands were a similar 3 nm height to the high packing density films, though some clearly had multiple layers of s-SWCNTs that were co-linear with the lower layers thus forming bundles as described in previous work. (S. M. Foradori, K. R. Jinkins, M. S. Arnold, Journal of Applied Physics 128 (23), 234301 (2020)], [S. M. Foradori, J. H. Dwyer, A. Suresh, P. Gopalan, M. S. Arnold, Applied Physics Letters 121 (7), 073504 (2022).)

The more fully packed morphology on the hydrophilic surface regions can be explained as follows. Because the hydrophilic surface regions retain water films, the contact line on the surface near the border of the hydrophilic and relatively hydrophobic regions is relatively stable, compared to the moving contact line on the uniform relatively hydrophobic regions, and the interaction time between the s-SWCNTs and the substrate is longer than on the relatively hydrophobic surface regions. The extra interaction time afforded by the relatively stable contact line can explain the very close packing of the films. This extra time would allow the s-SWCNTs to migrate right up to the previously deposited s-SWCNT, self-align to it, and form the closely packed films with very few gaps.

The high-resolution imaging allowed for the measurement of the degree of alignment as well as the packing density. Each s-SWCNT in a 325 nm square portion of the film was manually traced to determine the length and angle of each visible s-SWCNT segment. Histograms were then made and these lengths and angles, using a Gaussian fit and the standard deviation of the high packing density films on hydrophilic regions, were ~3.5°. The packing density results are summarized in Table 1.

Figure 6A:
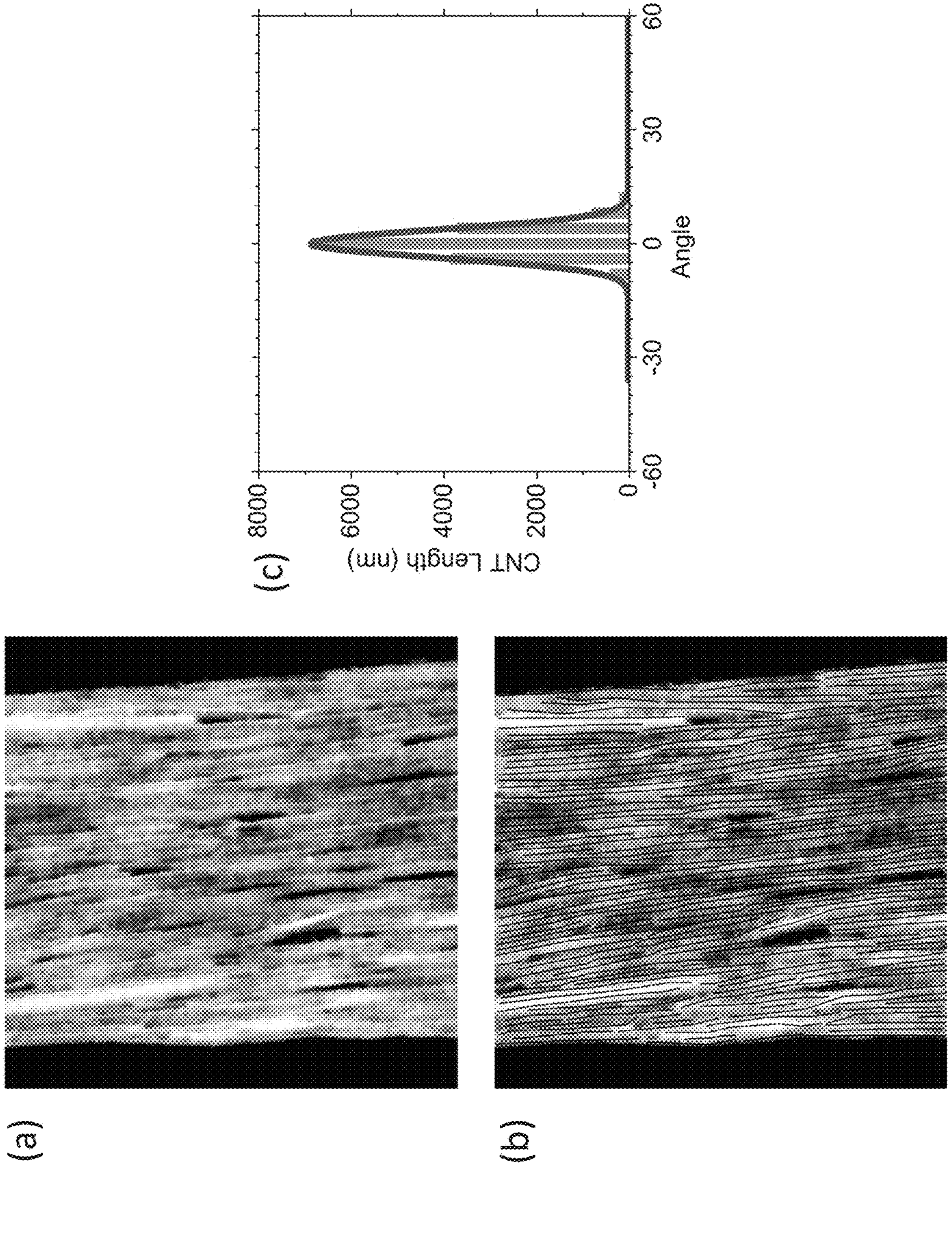
FIGS. 6A-6C shows high resolution AFM height images of s-SWCNT films (panels (a), superimposed manual traces of the visible s-SWCNT segments (panels (b)) and histograms of the angle distribution of the visible s-SWCNT segments (panels (c) for three s-SWCNT films deposited using surface-water-assisted TaFISA.
Figure 6B:
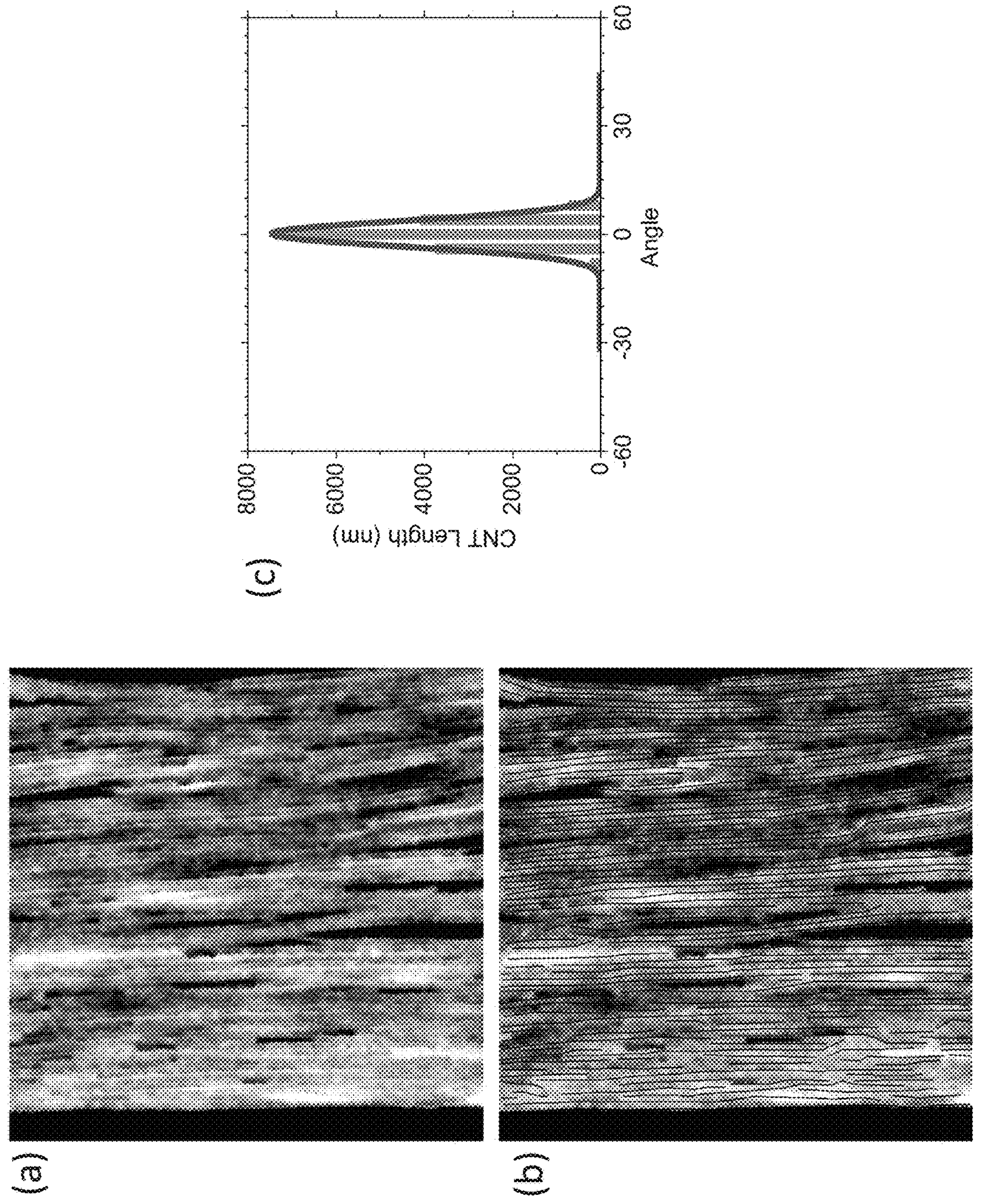
Figure 6C:
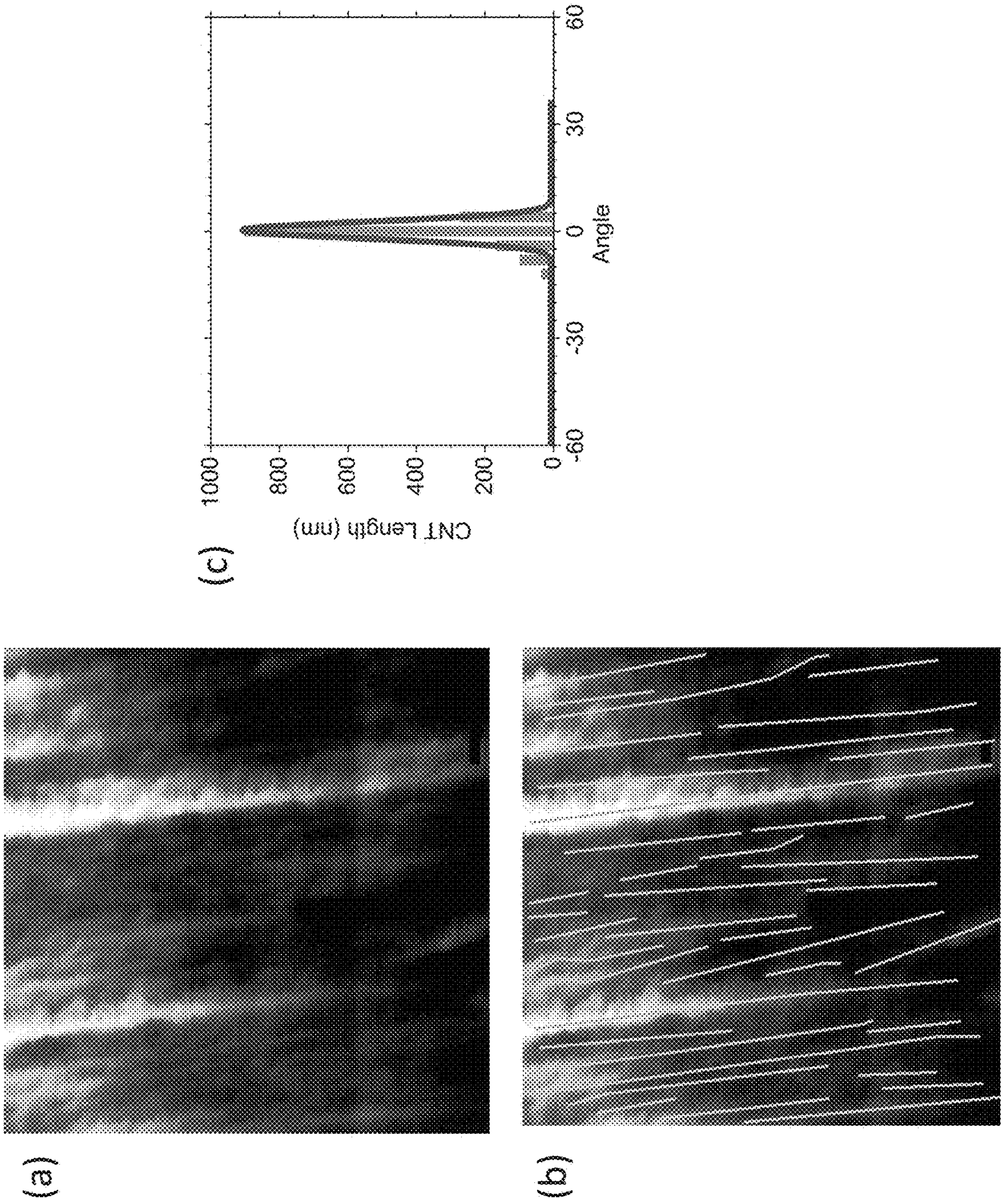

FIGS. 6A-6C shows high resolution AFM height images of s-SWCNT films (panels (a)), manual traces of the visible s-SWCNT segments (panels (b)) and histograms of the angle distribution of the visible s-SWCNT segments (panels (c)) for three of the s-SWCNT films deposited using surface-water-assisted TaFISA. The histograms were all centered to zero degrees to compensate for misalignment of the sample relative to the AFM probe scanning direction and any stage drift occurring of the long scans (~77-minute scan for each high-resolution image) The curves in the histograms are Gaussian functions fitted to the binned histogram data using Origin with standard deviations and $R^2$ values listed in Table 1 below.

TABLE 1

Gaussian Curve Fitting of s-SWCNT film Alignment Histograms

| Histogram Figure # | s-SWCNT Ink Conc. ($\mu g\ mL^{-1}$) | Standard Deviation (degrees) | $R^2$ |
|---|---|---|---|
| FIG. 6A | 5 | 3.64 ± 0.05 | 0.9980 |
| FIG. 6B | 5 | 3.50 ± 0.04 | 0.9987 |
| FIG. 6C | 100 | 4.74 ± 0.13 | 0.9868 |

More concentrated inks (>20 $\mu g\ mL^{-1}$) can deposit more s-SWCNTs at the ink-water interface where the s-SWCNTs can interact and form two-dimensional liquid crystals. These interfacial liquid crystals also can be aligned by the shear force of the flowing ink. When this interfacial liquid crystal is deposited on a hydrophilic surface region, it is transferred to the surface of the retained water film instead of being directly deposited on the substrate surface. When the hydrophilic surface region is patterned into stripes oriented to the liquid crystal's alignment direction, the retained water film-substrate contact lines constrain the liquid crystal and preserve the global alignment of the s-SWCNT film. The self-alignment process condenses the constrained liquid crystals into high packing density films. In narrow hydrophilic stripes (<=~100 μm) the condensed s-SWCNT film typically deposits near the first edge of the hydrophilic surface region to pass through the ink-water interface and leaves a gap on the bottom edge of the stripe where retained surface water likely prevents the deposition of other s-SWCNTs. In wider stripes (200 and 300 μm) the s-SWCNT film is held in the center of the stripe by connections to the films fixed in place on the relatively hydrophobic surface regions on either end of the stripe.

Large area depositions are desirable for many applications, so films were deposited on a sample with a set of 100 μm by 2 mm stripes spanning a 25×25 mm region, and closely packed and well aligned films were deposited in almost every hydrophilic stripe.

Figure 7:
FIG. 7 shows a high-resolution AFM height image of a semiconducting single-walled carbon nanotube film that is used as the channel in a field effect transistor (FET) in the Example.
Figure 8A:
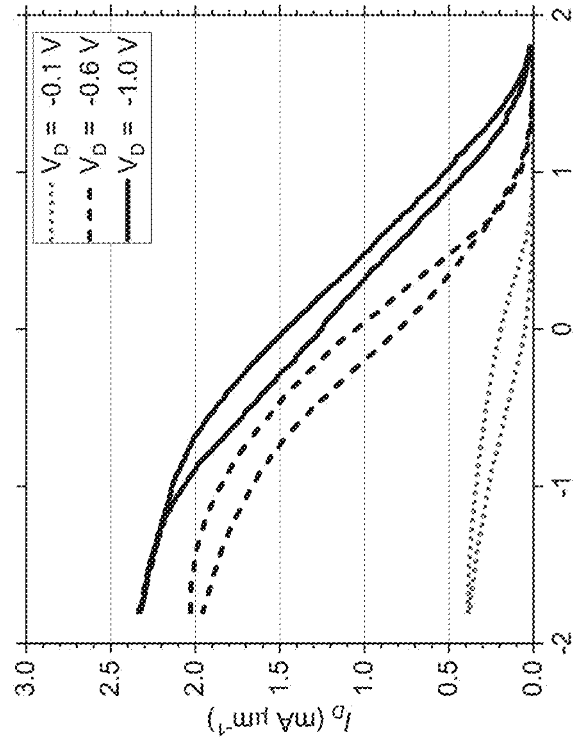
FIGS. 8A and 8B shows representative transfer curves of an FET made on the high packing density film of semiconducting single-walled carbon nanotubes shown in FIG. 7.
Figure 8B:
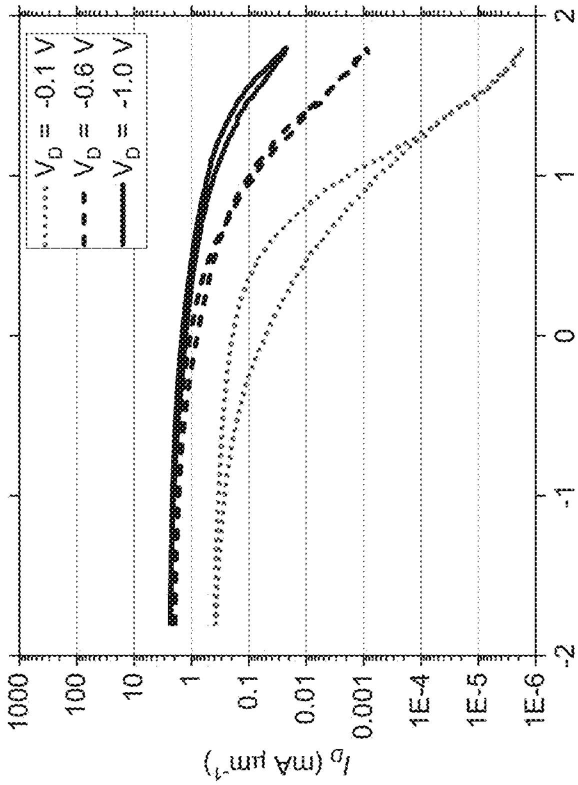
Figure 8C:
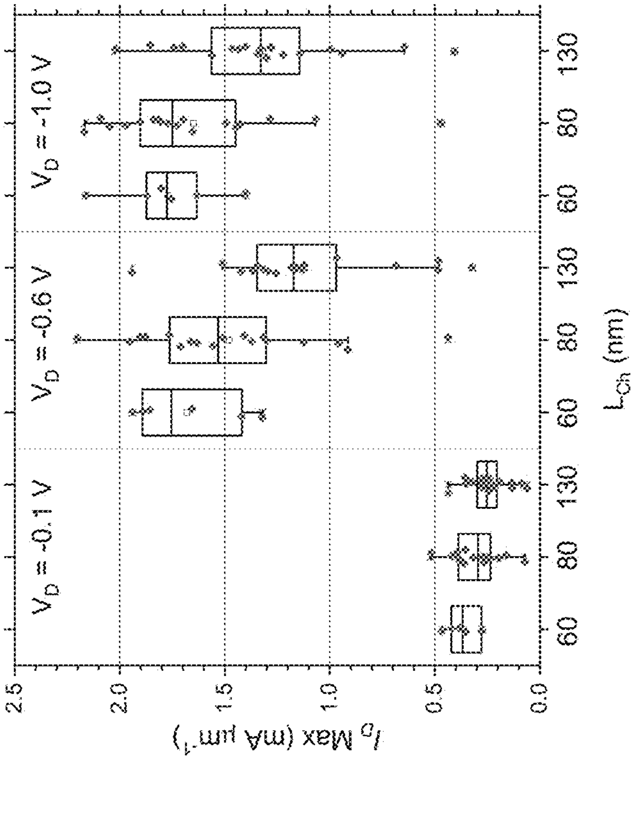
FIGS. 8C and 8D show plots of the maximum current density (FIG. 8C) and maximum transconductance (FIG. 8D).
Figure 8D:
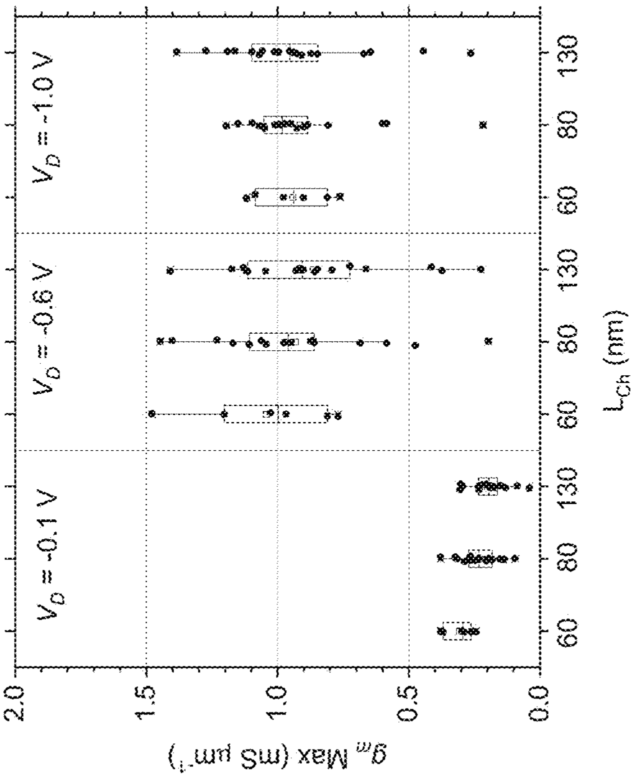

To determine how the improved alignment and increased packing density of the s-SWCNT films affect their electronic performance, top gated FETs were fabricated using a 5 nm $HfO_2$ atomic layer deposition insulator. The films were made using 100 $\mu g\ mL^{-1}$ s-SWCNT ink from the high packing density films (FIG. 7) on 100 μm hydrophilic stripes. Example transfer curves from the devices and plots of current density and transconductance are shown in FIGS. 8A-8D.

Detailed Methods and Materials:

Hydrophilic Pattern Fabrication: The hydrophilic patterns were made using a lithographic process on thermal oxide coated Si wafers. The desired hydrophilic pattern was formed using an e-beam lithography system with a polymethyl methacry late (PMMA) resist. Very large regions were patterned using a foil shadow mask and UV/ozone chamber to dry etch the resist. After development, the patterned wafers were cleaned in a UV/ozone chamber and then 2 or 3 nm of yttrium metal was deposited in a thermal evaporator that was built into a nitrogen glovebox. After removal from the glovebox and completing a standard liftoff process using hot acetone, the substrates were again placed in a UV/ozone chamber at 90° C. for 8 minutes to clean and oxidize all the surfaces, as well as to oxidize the deposited yttrium metal. The samples were then treated with HMDS using either a vapor or liquid process. The exposure time and concentration were calibrated to partially functionalize the non-patterned regions to a water contact angle of 35-45 degrees. Alternatively, the samples were prepared, by overexposure to HMDS to produce WCA values greater than 45 degrees, then using short exposures in a UV/ozone chamber to lower the WCA to the target of 35-45 degrees. Just before the s-SWCNT deposition process, the oxidized yttrium thin films, now ~3-5 nm thick due to oxidation, were removed using a 5 second dip in dilute aqueous hydrochloric acid (1:25 v/v, ~0.1 molarity), followed by a quick dip/rinse in clean DI water then dried with compressed nitrogen. At this point, the prepared samples had a 35-45° WCA in the non-patterned regions and a very hydrophilic surface (<10° WCA) in the regions that previously had the oxidized yttrium thin film.

s-SWCNT Deposition Processes: s-SWCNT inks were made from poly[(9,9-dioctylfluorenyl-2,7-diyl)-alt-(6,6'-[2,2'-bipyridine])](PFO-BPy)-wrapped and sorted arc discharge s-SWCNTs dispersed in chloroform using a previously published procedure. (G. J. Brady, A. J. Way, N. S. Safron, H. T. Evensen, P. Gopalan, M. S. Arnold, Science Advances, 2 (9) (2016).) Two deposition processes were used to make s-SWCNT films. The films made with a TaFISA process were made using a previously published process. (K. R. Jinkins, Aligned 2D carbon nanotube liquid crystals for wafer-scale electronics, Science Advances, 2021, Vol. 7, Issue 37.) Two substrates were inserted in a water bath at 45° with their surfaces facing each other to make a 3 mm wide channel. A needle injected the chloroform-based s-SWCNT ink across the top of the water surface in the channel between the two substrates (4 mL $min^{-1}$) while the substrates were lifted through the ink-water interface at 40) mm $min^{-1}$. In this Example, one of the substrates had the hydrophilic chemical patterns and the other, sacrificial substrate was treated with HMDS to have a ~40° WCA. The films made for calibrating the Raman based measurement of packing density were made using a shear alignment technique using a previously published process. (Jinkins. Katherine R . . . et al. "Substrate-Wide Confined Shear Alignment of Carbon Nanotubes for Thin Film Transistors." *Advanced Electronic Materials* 5.2 (2019): 1800593.) The chloroform-based s-SWCNT ink is injected with a high volumetric flow rate into a sub-mm height and ~1 cm wide and 2.5 cm long channel formed between the substrate and a highly polished metal surface. The high flow rate and confined channel dimensions generate a large amount of shear that aligns the s-SWCNTs in the direction of ink flow as they are deposited on the substrate.

Water Contact Angle Measurement: Static water contact angle measurements were performed using a Dataphysics OCA 15 optical contact angle system. Depending on the surface condition, DI water droplets of 2 to 5 μL were dispensed and the contact angle immediately measured.

Atomic Force Microscopy: AFM images were collected on a Bruker Icon instrument using a TESPA and/or ScanAsist-Air probes for low resolution imaging and SAA-HPI-SS probes for high resolution imaging. High resolution images were collected with square pixel sizes of approximately 0.3 nm.

Transmission Electron Microscopy: s-SWCNT films on $Si/SiO_2$ substrates were sent to Eurofins EAG Laboratories (Santa Clara, CA, USA) for sample preparation and TEM imaging. The samples were prepared using the ex-situ focused ion beam (FIB) lift out technique on a FEI Dual Beam FIB/SEM and were capped with Carbon-based Epoxy/I-C prior to milling. TEM imaging was performed on a FEI Tecnai Osiri FEG/TEM operated at 200 kV in bright-field TEM mode and high-resolution TEM mode.

FET Device Fabrication: A 100 kV E-beam system (Elionix G-100) was used to lithographically pattern devices using a multi-step process. After deposition of alignment marks and s-SWCNT films, unwanted s-SWCNTs were removed using a radiofrequency (RF) oxygen plasma etch. Electrodes were deposited in two steps: first the high precision channel forming electrodes, and second the large contact pads. The conformal 5 nm $HfO_2$ insulator for the top gate was deposited by atomic layer deposition (Veeco Fiji G2 PE-ALD). The top gate metal was deposited on top of that insulating layer.

s-SWCNT Sorting and Ink Fabrication: Single wall arc discharge carbon nanotubes were purchased (Aldrich, 698695) and sorted to isolate semiconducting s-SWCNTs by sonicating with toluene solutions of PFO-BPy (ADS Dyes, ADS153UV, Poly[(9,9-dioctylfluorenyl-2,7-diyl)-alt-co-(6,6-{2,2"-bipyridine})], $MW_N$=~40 to 100 kDa). A mixture of 120 mg of raw s-SWCNT powder and 60 mL of 2 mg $mL^{-1}$ PFO-BPy in toluene were sonicated using a Fisher sonic dismembrator model 500 (400 W) for 30 minutes at 40% power in a 150 mL beaker surrounded by a static water bath for cooling. Next, the solution was divided into six tubes that were centrifuged with a swing bucket rotor (Sorval WX, TH-641, Thermo Scientific) at 41,000 rpm (300,000 g, max) for 10 minutes to remove soot and undispersed s-SWCNTs. The top ~90% of the suspension was collected, and this process was repeated for a total of six batches. The combined suspensions from all six batches were condensed using a rotary evaporator down to ~50 mL and then centrifuged again (same rotor and speed) for 1 hour to precipitate any poorly dispersed s-SWCNTs. The top suspension was collected, diluted to 60 mL with toluene, and centrifuged again (F65L-6×13 rotor at 25,500 rpm for 24 hours: in 10 mL PTFE tubes with ETFE caps, part 3114-0010, Thermo Scientific Nalgene) to form a pellet of all the suspended semiconducting s-SWCNTs. The pellet was separated from the PFO-BPy rich supernatant which was discarded. The semiconducting s-SWCNT pellets were redispersed in fresh toluene using stirring on a hot plate set at 80° C., and the pelleting process was repeated two or three more times to reduce the mass ratio of PFO-BPy: s-SWCNT to ~0.5:1 as measured by UV/Vis/NIR absorption spectroscopy. The s-SWCNT ink was prepared by dispersing the final pellet into chloroform (Fisher Scientific, C606-4) and diluting to a concentration of 100 μg s-SWCNT $mL^{-1}$.

Figure 9:
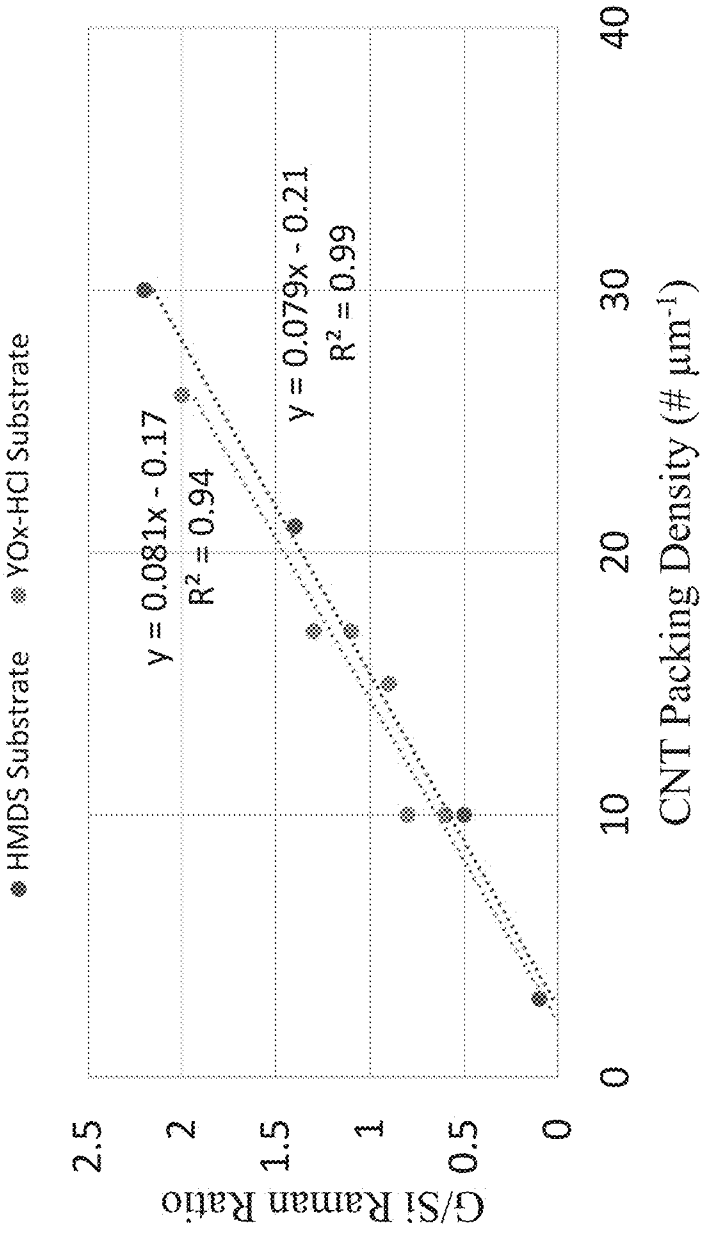
FIG. 9 shows calibration data correlating the packing density of a semiconducting single-walled carbon nanotube film measured by AFM imaging to the ratio of the semiconducting single-walled carbon nanotube G peak to Si 520 $cm^{-1}$ peak of Raman spectra of a semiconducting single-walled carbon nanotube film measured on both a hexamethyldisilazane (HMDS) treated substrate and a yttrium oxide treated hydrophilic substrate. Both substrates produced similar calibration results when fitted using least squares regression.

Raman Spectroscopic Measurement of s-SWCNT Film Packing Density:

Raman spectroscopy was also used to characterize the packing density and alignment of s-SWCNT films, and those results corroborate the high packing density and excellent alignment results. Using Raman spectroscopy to measure the packing density of s-SWCNTs in a film, a calibration curve is necessary. The intensity of s-SWCNT peaks in a Raman spectrum are dependent on many spectrometer and sample prep factors, so care must be taken to ensure the calibration and unknown samples are measured under the same conditions. Two sets of calibration samples were fabricated using a shear force alignment method (ShASAM) described elsewhere. (Jinkins. Katherine R . . . et al. "Substrate-Wide Confined Shear Alignment of Carbon Nanotubes for Thin Film Transistors." *Advanced Electronic Materials* 5.2 (2019): 1800593.) The s-SWCNT packing density at marked locations was measured using AFM since that imaging technique does not contaminate the sample surface. This deposition technique was used because it is expected to deposit individual s-SWCNTs in relatively well aligned films. The deposition of individualized s-SWCNTs is important since the calibration relies on manually counting the s-SWCNTs in particular locations to determine the density. If bundles of s-SWCNTs were deposited, then the number of s-SWCNTs present in any location would be undercounted since a feature that looks like a single s-SWCNTs might be 2 or more s-SWCNTs that were not resolved. Raman spectra were collected at those same locations, and the packing density and spectral information was used to generate the calibration curves shown in FIG. 9. Since all the samples had been prepared on pieces of a $Si/SiO_2$ wafer, the intensity of the Si peak at 520 $cm^{-1}$ was used as a type of internal standard and the ratio of the s-SWCNT G peak height at ~1580 $cm^{-1}$ to the Si peak height was used as the measured signal. The calibration curve spanned packing densities of ~3 to ~30 s-SWCNT $\mu m^{-1}$ and G/Si ratios of ~0.1 to 2.3. (FIG. 9). Calibration curves were measured for s-SWCNT arrays on HMDS treated $SiO_2$ and on hydrophilic $SiO_2$ fabricated using the same yttrium based process used to make patterned regions and the calibration curves on both surfaces were found to be equivalent.

Spectra of films high packing density were collected using the same conditions and were found to have a maximum G/Si ratio of ~17, corresponding to a packing density of ~210 s-SWCNT $\mu m^{-1}$. This indicates a very high packing density that is outside the range of the calibration curve. Extrapolating this calibration curve outside of its measured range provides a rough estimate of the s-SWCNT packing density of greater than 200 s-SWCNTs $\mu m^{-1}$.

Polarized Raman spectroscopy can be used to determine the degree of alignment of a s-SWCNT film because of a combination of the one-dimensional nature of s-SWCNTs and the enhancement of the Raman signal due to the s-SWCNT's electronic transition near the energy of the Raman laser. If the excitation laser energy is near to an optically active electronic transition, the intensity of a Raman signal is highly enhanced. In s-SWCNTs laying on a surface, the absorption cross-section of a photon approaching normal to the surface is proportional to the square of the cosine of the angle, a, between the polarization of the photon and the direction of the long axis of the s-SWCNT. When using a polarized filter before the detector, the Raman signal of that s-SWCNT is also proportional to the square of the cosine of the angle between the polarizer and the long axis of the s-SWCNT. Combining a polarized light source and polarized scattered photons, both at the same angle, the Raman signal intensity of a s-SWCNT oriented with angle $\alpha$ to those polarizers is proportional to $\cos^4(\alpha)$. By knowing the orientation of the polarizers, the Raman signal can be used to determine the orientation of the s-SWCNT by holding the polarizers in a fixed position and using a rotating stage ($\beta$) to rotate the s-SWCNT. If a film of s-SWCNTs is measured instead of a single s-SWCNT, then each s-SWCNT in the film will contribute signal intensity based on its angle relative to the polarizers' angles. If the film is perfectly aligned, the Raman signal will be proportional to $\cos^4(\beta)$ as the sample is rotated.

Practical considerations of the spectroscopy equipment must be considered to ensure accurate measurements. The polarizers must be aligned at the same angle and that angle must be aligned to the beam splitter. If the polarizers are misaligned, then the signal will be artificially attenuated. If the laser polarization is not aligned to the beam splitter, then the light exiting the beam splitter will be elliptically polarized instead of linearly polarized. The equipment used in this measurement used a half-wave plate to adjust the polarization angle of the laser and an adjustable polarizer in the beam path just before the detector mirrors, gratings, and detector. Both of those optical elements were mounted in holders with stepper motors and were installed in the spectrometer only when needed. Matching the laser and detector polarization angle and matching that angle to the beam splitter requires careful measurements. This data was collected on a confocal Raman microscope using a 50×, long working distance objective, and the spot size was ~1-3 μm depending on how tightly focused the beam was. This small spot size means the rotating sample stage must be very precisely centered (and flat) or different portions of the film will be measured as the sample is rotated.

Figure 10A:
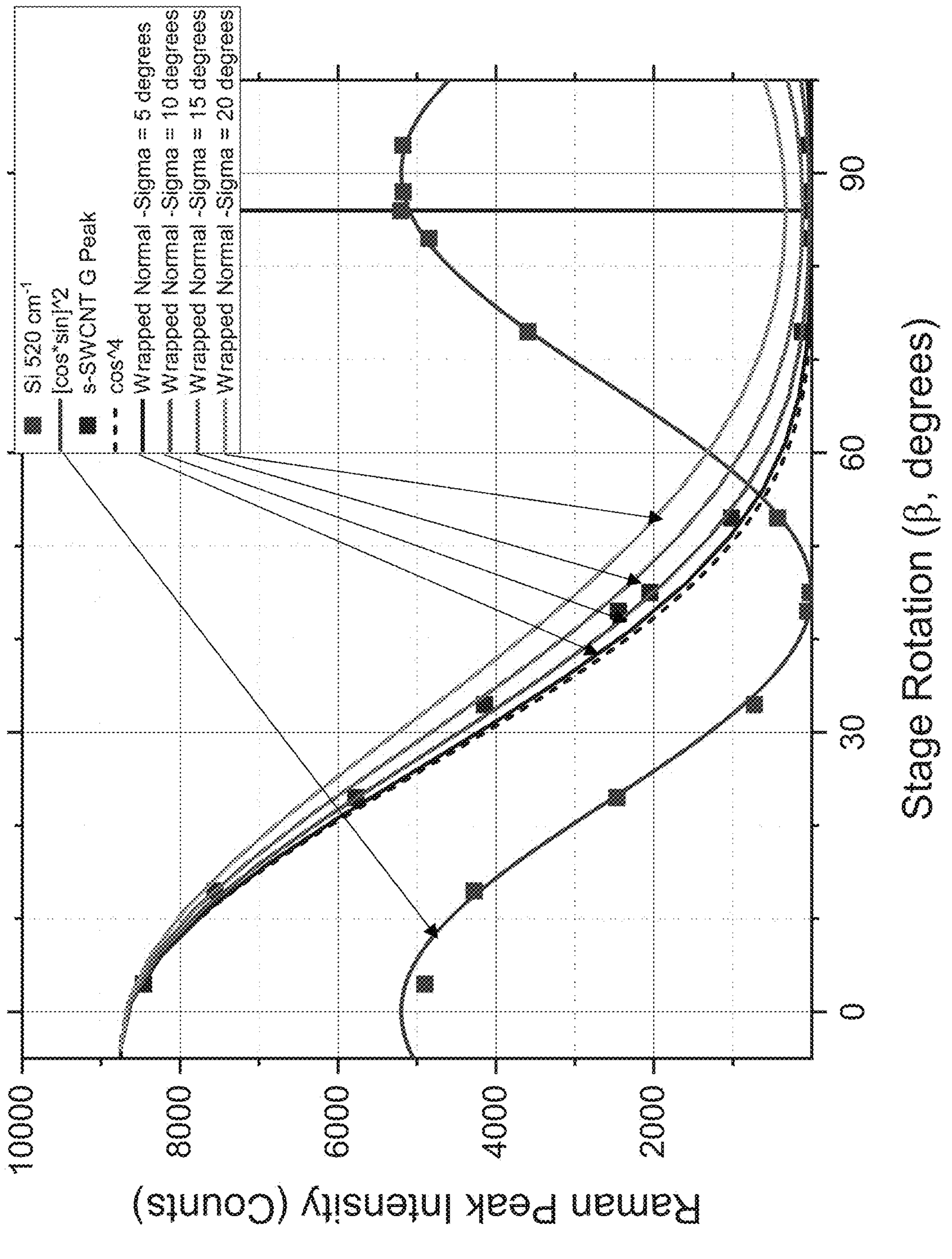
FIG. 10A shows Raman spectroscopic measurements of semiconducting single-walled carbon nanotube film alignment.
Figure 10B:
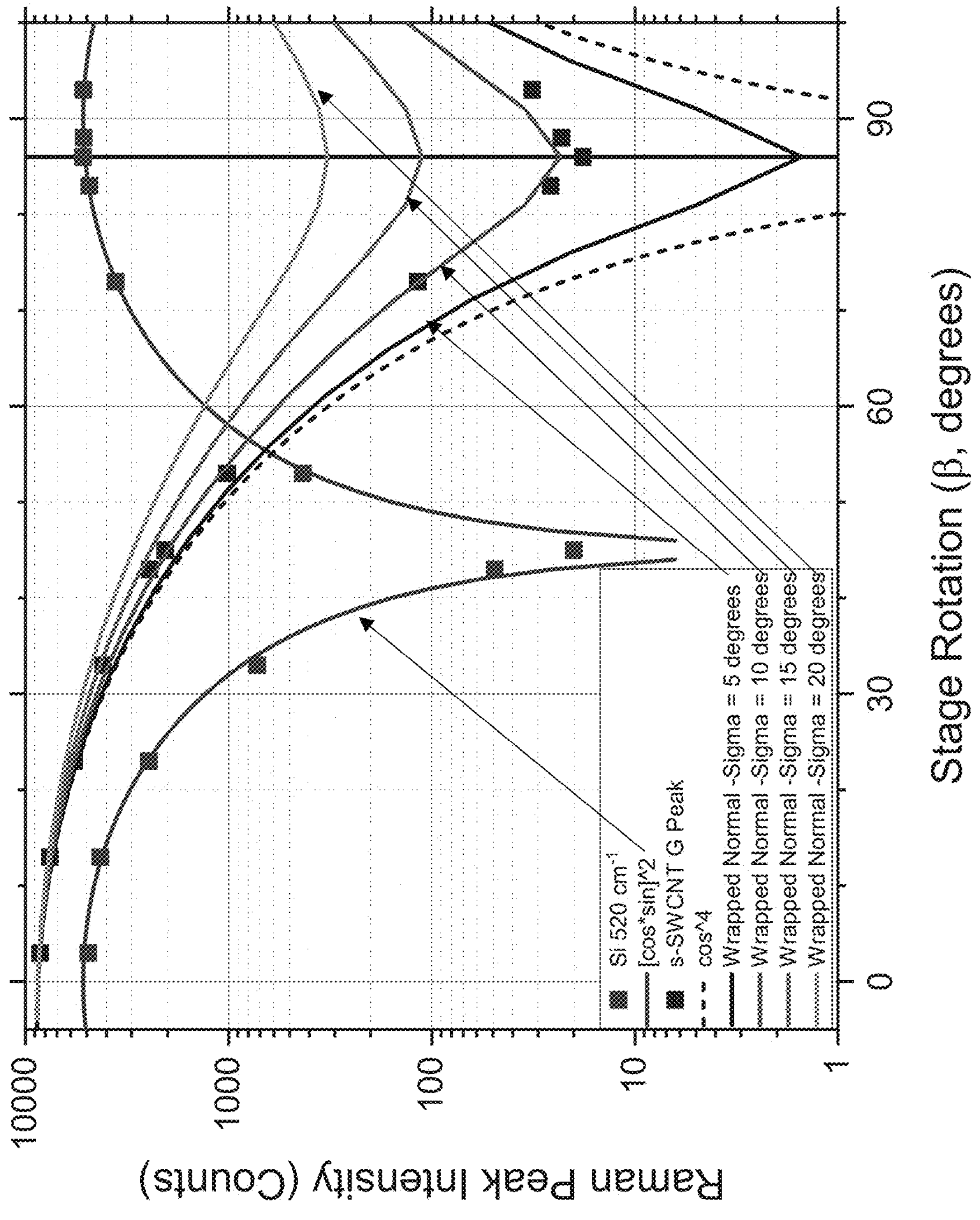
FIG. 10B shows linear and logarithmic Raman signals of semiconducting single-walled carbon nanotube G peak and Si 520 $cm^{-1}$ of a closely packed film of semiconducting single-walled carbon nanotubes on a $Si/SiO_2$ (~130 nm) sample as a function of sample rotation. Data were collected using a polarized 532 nm laser and a polarizer in the scattered photon light path oriented parallel to the Raman laser. The dashed line is a $\cos^4(\alpha)$ curve fitted to the semiconducting single-walled carbon nanotube G peak max and minimums that represent the predicted signal of a perfectly aligned film of semiconducting single-walled carbon nanotubes under idealized polarization conditions. The solid lines are the predicted signals of semiconducting single-walled carbon nanotube films with various degrees of alignment disorder represented by a wrapped normal distribution with standard deviations of 5°, 10°, 15° and 20°. Also shown is a fitted $[\sin(\alpha)\cos(\alpha)]^2$ curve of the predicted Si 520 $cm^{-1}$ peak height under these polarization and sample rotation conditions.

After aligning the polarizers, one high packing density and highly aligned film was mounted on a rotating stage and measured at various angles. The intensity of the G peak vs sample rotation is plotted in FIGS. 10A and 10B. Low power and long exposures were used to avoid damaging the s-SWCNTs from exposure to the highly focused laser. Also plotted in those figures are simulated curves of films with perfect alignment and curves with alignment modeled using a wrapped normal distribution with increasing alignment disorder. Comparison of the measured data to the simulated curves shows the film alignment matched the modeled films with sigma between 5 to 15 degrees in the 15-75-degree stage rotation positions. When plotted on a log scale, the data closely matched the sigma=10-degree simulated film. Also plotted were the intensity of the 521 $cm^{-1}$ Si peak and the expected intensity of a Si<100> oriented sample measured under these polarization conditions. The close match of the Si measured intensity to the expected values indicates the polarization optics were properly aligned for this measurement and the minimum peak height also provides an indicator of the quality of the polarization optics and stage alignment. This represents a combination of the extinction coefficients of the polarizers, the relative alignment of the laser polarization to the detector polarizer, the alignment of the laser polarization to the beam splitter, the flatness of the stage, the polarization ratio of the Raman laser, and the alignment of the rest of the optical elements in the light path, so it combines many experimental factors.

The intensity ratio of the s-SWCNT Raman spectra of the film aligned parallel to and perpendicular to the matched laser and detector polarizers has been used to determine the degree of alignment of s-SWCNT films. For the data measured, the ratio is (8465/18)=470 and this corresponds to a wrapped normal distribution with a standard deviation of approximately 9.4°. When comparing the measured ratio of 470 to the expected polarization ratio of the Raman laser (nominally 1000:1) and including all the potential sources of error described above, it becomes apparent that this measurement is likely near the performance limits of this equipment. To see how the measurement limit relates to the expected results for the closely packed films, the film alignment measurements provided by the AFM images were used to calculate the expected parallel to perpendicular ratio (Table 2).

TABLE 2

Predicted Polarized Raman Measurements

| Histogram Figure | Description | Predicted Parallel/ Perpendicular Peak Height Ratio |
|---|---|---|
| 6A | First low conc | 3253 |
| 6B | Second low conc | 2133 |
| 6C | Center of wide close-packed film | 5301 |

*This table refers to the same images listed in Table 1, and they are listed in the same order for easy comparison.

FET Fabrication:

Highly p-doped silicon wafer pieces with ~15 nm of dry thermal oxide were cleaved to the desired size.

Alignment marks (global and local) were fabricated using e-beam lithography and 0.7/50 nm of Cr/Au using a ~290 nm thick PMMA resist (475 PMMA A6, 4000 rpm for 60 seconds, softbake at 185° C. for 90 seconds; development using 2:1 (v/v) isopropanol/methyl-isobutyl ketone in an ice bath at 0° C. for 40 seconds; liftoff using hot acetone. These softbake, development, and liftoff processes were the same for all subsequent process steps.).

Yttrium metal stripes (3 nm thick) were fabricated using e-beam lithography with a ~55 nm thick PMMA resist (950 PMMA C1, 2000 rpm for 60 seconds). UV/ozone cleaning was carried out at 90° C. for 8 minutes (and a 3-minute air purge, also at 90° C.). HMDS surface treatment (vapor or liquid) was used to achieve a water contact angle of ~40° in regions without oxidized yttrium. Etching of the oxidized yttrium used a 5 second dip in dilute aqueous hydrochloric acid (1:25 v/v, ~0.1 molar HCl concentration), followed by a dip rinse in DI water and blow dry with nitrogen. Deposition of s-SWCNT films using the TaFISA process was as described above.

The FET channel was defined using an RF oxygen plasma etch. The desired s-SWCNTs were protected with an e-beam patterned PMMA mask (~100 nm, 950 PMMA C2, 4000 rpm, 60 seconds). Electrodes defining the FET channel were precisely written using e-beam lithography with ~100 nm thick PMMA resist, (950 PMMA C2, 4000 rpm, 60 seconds) and thermal evaporation of 10/10 nm of Pd/Au. Thick contact pads were deposited on the channel electrodes to ensure low device electrode resistance and were fabricated using e-beam lithography and ~290 nm thick PMMA resist (475 PMMA A6, 4000 rpm for 60 seconds) and 10/80 nm of Pd/Au.

Atomic Layer Deposition (Veeco Fiji G2 PE-ALD) was used to deposit 5 nm of $HfO_2$ on all surfaces (150° C., 41 cycles alternating Hf-TDMAH [tetrakis(dimethylamido) hafnium (IV)] and water pulses).

Top gate metal was deposited using e-beam lithography with ~100 nm thick PMMA resist, (950 PMMA C2, 4000 rpm, 60 seconds) and thermal evaporation of 0.7/20 nm of Cr/Au.

Contact to the source and drain electrode pads were made using gold coated tungsten needles in a custom-built probe station. The 10/80 nm Pd/Au on $SiO_2$ electrode pads had an intermediate adhesion strength, and application of moderate pressure with the probe needles allowed scratching/delamination of the metal and penetration of the thin 5 nm $HfO_2$ insulating layer.

Some devices were fabricated with intentional shorts across the channel to measure the electrode resistance which was 20-40 Ohms.

TABLE 3

FET Device Dimensions and Parameters:

| Parameter | Value |
|---|---|
| Channel Length | 60, 80 or 130 nm |
| Channel Width | 1.08 μm |
| Channel Electrode Composition | 10 nm Pd/10 nm Au |
| Probe Contact Electrode Composition | 10 nm Pd/~80 nm Au |
| Gate Metal Composition | 0.7 nm Cr/30 nm Au |
| Substrate Insulator Composition | ~15 nm Dry Thermal Oxide |
| Top Gate Insulator Composition | 5 nm of ALD $HfO_2$ (deposited at 150° C.) |
| Short Material Composition (only for measuring electrode resistance) | 10 nm Pd/~80 nm Au (fabricated in same step as Probe Contact Electrodes) |
| Electrode Resistance | 20 to 40 Ohms |

Example 2: Surface Water-Assisted ShASAM

This example demonstrates elongated nanoparticle film deposition processes for delivering water and an s-SWCNTs-containing ink (i.e., an s-SWCNT suspension) to a substrate that differ from those described in Example 1. The principle of the film deposition mechanism is the same for this example as was described in Example 1 and so demonstrates that the methods are not restricted to any particular process for delivering liquids or s-SWCNT inks to the substrate.

The s-SWCNT films were deposited using a variant of the ShASAM process which is described in detail elsewhere. (Jinkins, Katherine R., et al. "Substrate-Wide Confined Shear Alignment of Carbon Nanotubes for Thin Film Transistors." *Advanced Electronic Materials* 5.2 (2019): 1800593.) The flow channel apparatus used to in this example is shown in FIG. 1 of Jinkins et al. (2019). The substrate was placed between two metal plates with the target surface facing the smooth polished surface of one plate wall with a gasket and stainless-steel foil spacers between them. The foil spacers are slightly thinner than the gasket so when the screws holding the metal plates together are tightened the gasket is compressed to the thickness of the foil spacers. This forms an open flow channel between the substrate surface and the polished metal surface with a liquid tight seal and gap equal to the thickness of the foil spacers. The polished metal plate has a liquid inlet at one end of the substrate and the gasket is open at the other end, such that a liquid injected into the channel flows across the substrate in one direction from the inlet to the gasket opening. First water was injected into the channel and allowed to drain. Next a set of three liquids were staged in the inlet line: first 0.5 mL of chloroform saturated with water, then 0.25 mL of chloroform containing 125 μm/mL of s-SWCNTs, and last 3.25 mL of dry chloroform. This set of liquids was injected into the channel inlet at a volumetric flow rate of 100 mL/min and then followed with a manual injection of ~10 mL 2-propanol. The high velocity injection of the s-SWCNT ink into the narrow channel results in a high shear rate of up to 10,000 $s^{-1}$. On the patterned hydrophilic regions of this sample with retained surface water the s-SWCNTs are deposited on the chloroform-water interface and migrate to the chloroform-water-substrate contact line where they deposit aligned with the direction of the contact line which may or may not be aligned with the direction of liquid flow. On substrates with no patterning and no retained surface water the high shear liquid flow aligns the s-SWCNTs to the direction of the ink flow as they are deposited on the substrate directly from the chloroform ink.

Figure 11A:
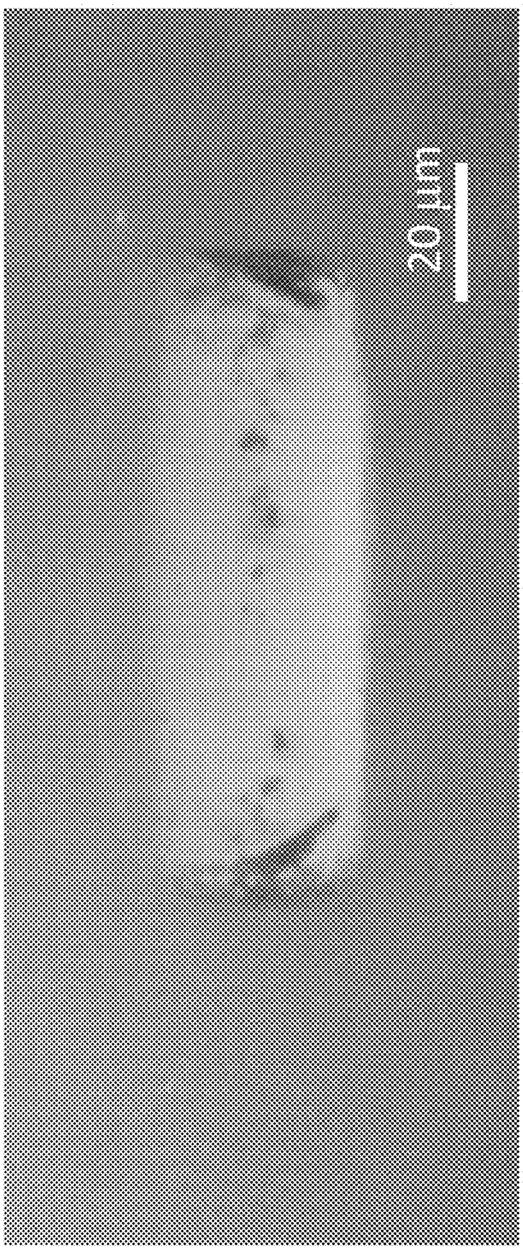
FIGS. 11A and 11B show cross-polarized optical images of a s-SWCNT film in accordance with Example 2.
Figure 11B:
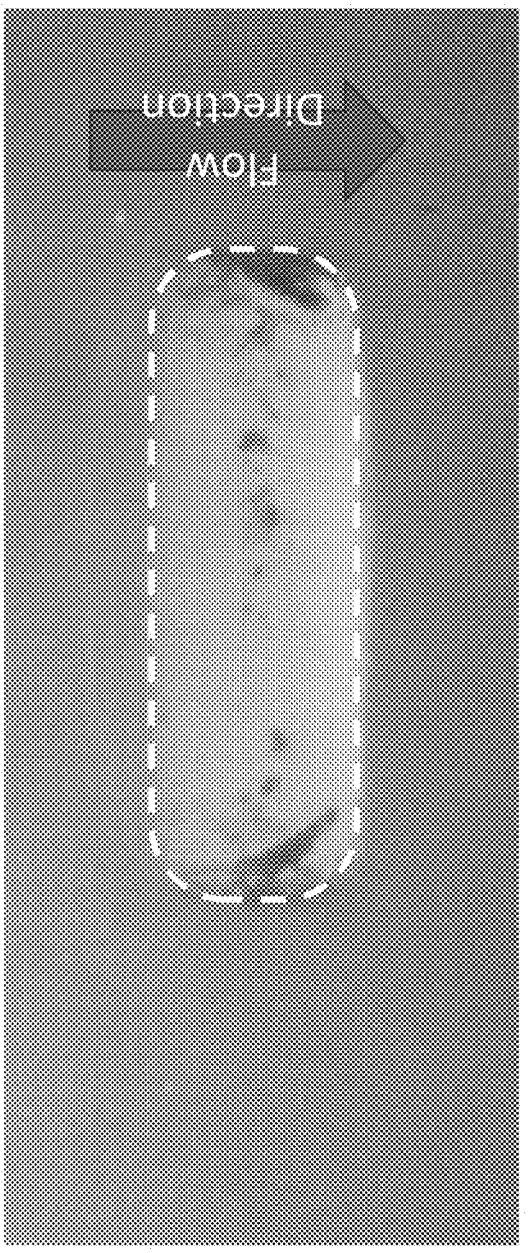

FIGS. 11A and 11B show cross-polarized optical images of a s-SWCNT film deposited as described above, including a rectangular region of retained surface water. Carbon nanotube arrays imaged with cross polarized light have a contrast that is dependent on their alignment direction and packing density. (Deng, Shibin, et al., "High-Throughput Determination of Statistical Structure Information for Horizontal Carbon Nanotube Arrays by Optical Imaging" Advanced Materials, 2016, Volume 28, Issue 10, pages 2018-2023.) If polarization directions of linear polarizing filters on the light source and detector are set at ~80 to 89° relative to each other, and a carbon nanotube array is arranged at 45° to one of the polarizing filters, then the contrast of the carbon nanotube array is dependent on the direction and packing density of the array. An array in one direction will appear bright against the neutral background and an array in the perpendicular direction will appear dark against the neutral background. The degree of contrast is a function of the packing density of the array and the uniformity of alignment direction of the nanotubes within the array, as well as the relative angle between the two linear polarizing filters. In FIG. 11A and FIG. 11B the polarizers are set to show horizontally aligned arrays as bright and vertically aligned arrays as dark. FIG. 11B is a copy of FIG. 11A showing the region with retained water as a white dashed rectangle with rounded corners. The s-SWCNT array (i.e., deposited film) within the retained surface water region is bright along the horizontal sides of the rectangle, and in most of the interior regions, indicating the s-SWCNTs in the deposited film are horizontally aligned as directed by the horizontal chloroform-water-substrate contact line. On the left and right sides, however, the film image is dark indicating the s-SWCNTs in the film are aligned vertically as directed by the vertical chloroform-substrate-water line on the sides of the retained surface water region. The regions around the retained water region also have s-SWCNTs deposited, but their packing density and degree of alignment is low, relative to the region with retained surface water, so they have very little contrast in these imaging conditions. The images in FIGS. 12A and 12B are AFM height images showing representative s-SWCNT films from an unpatterned sample without retained surface water fabricated under similar ink concentration, volume and flow rate conditions without filling the channel with water before the deposition (FIG. 12A) and from a patterned sample with in a region with retained surface water fabricated as described above (FIG. 12B). These images show the increase in packing density and uniformity of alignment direction improvement gained by using the invention.

Cross-Polarized Optical Microscopy: Optical images were collected on a Nikon Optiphot-2 microscope equipment with a fixed direction linear polarizing filter in the camera light path and a rotatable linear polarizing filter in the light source path.

The foregoing description of illustrative embodiments of the invention has been presented for purposes of illustration and of description. It is not intended to be exhaustive or to limit the invention to the precise form disclosed, and modifications and variations are possible considering the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A method of forming a film of aligned elongated nanoparticles on a substrate, the method comprising:

providing a substrate having at least one liquid film-adsorbing surface region bounded by at least one liquid film-repelling surface region, wherein the at least one liquid film-adsorbing surface region and the at least one liquid film-repelling surface region are co-planar on a surface of the substrate;

forming a liquid film on the at least one liquid film-adsorbing surface region, wherein the liquid film is bounded by the at least one liquid film-repelling surface region;

contacting a suspension that comprises dispersed elongated nanoparticles with the at least one liquid film, wherein the suspension is immiscible with the at least one liquid film, such that the at least one liquid film and the suspension form an interface and elongated nanoparticles are transferred from the suspension to a surface of the at least one liquid film at the interface; and allowing the at least one liquid film to dissipate, whereby the elongated nanoparticles are deposited on the at least one liquid film-adsorbing surface region along a contact line defined by: the liquid film; the substrate; and the suspension or air, as the liquid film dissipates.

2. The method of claim 1, wherein the at least one liquid film-adsorbing surface region is more hydrophilic than the at least one liquid film-repelling surface region.

3. The method of claim 2, wherein the at least one liquid film is an aqueous liquid film.

4. The method of claim 1, wherein the at least one liquid film-adsorbing surface region is less hydrophilic than the at least one liquid film-repelling surface region.

5. The method of claim 1, wherein forming the liquid film on the at least one liquid film-adsorbing surface region comprises flowing a liquid over the at least one liquid film-adsorbing surface region to wet the at least one liquid film-adsorbing surface region, whereby the liquid is retained on the at least one liquid film-adsorbing surface region and not on the at least one liquid film-repelling surface region.

6. The method of claim 1, wherein contacting the suspension with the at least one liquid film comprises flowing the suspension over the at least one liquid film.

7. The method of claim 1, wherein forming the liquid film on the at least one liquid film-adsorbing surface region comprises submerging at least one liquid film-adsorbing surface region in a liquid and withdrawing the at least one liquid film-adsorbing surface region from the liquid, whereby the liquid film is retained on the at least one liquid film-adsorbing surface region after said at least one liquid film-adsorbing surface region has been withdrawn from the liquid.

8. The method of claim 1, wherein the steps of forming a liquid film on the at least one liquid film-adsorbing surface region and contacting a suspension that comprises dispersed elongated nanoparticles with the at least one liquid film are carried out by forming a layer of the suspension on the liquid, submerging the at least one liquid film-adsorbing surface region in the liquid, and withdrawing the at least one liquid film-adsorbing surface region from the liquid and through the layer of the suspension.

9. The method of claim 8, wherein the layer of the suspension is continuously flowed over the liquid as the at least one liquid film-adsorbing surface region is withdrawn from the liquid and through the layer of the suspension.

10. The method of claim 1, wherein the elongated nanoparticles are carbon nanotubes.

11. The method of claim 10, wherein the elongated nanoparticles are semiconducting single-walled carbon nanotubes.

12. The method of claim 11, wherein the semiconducting single-walled carbon nanotubes have a linear packing density of at least 200 semiconducting single-walled carbon nanotubes per μm in the film of aligned semiconducting single-walled carbon nanotubes.

13. The method of claim 1, wherein the film of aligned elongated nanoparticles has an area of at least 50 $cm^2$.

14. The method of claim 1, wherein the substrate is a silicon substrate.

15. The method of claim 14, wherein the at least one liquid film-adsorbing surface region comprises silicon dioxide.

16. The method of claim 15, wherein the at least one liquid film-repelling surface region comprises an organic polymer or organic functional groups.

17. A method of forming a film of aligned semiconducting single-walled carbon nanotubes on a substrate, the method comprising:

providing a substrate having at least one liquid film-adsorbing surface region bounded by at least one liquid film-repelling surface region;

forming a liquid film on the at least one liquid film-adsorbing surface region, wherein the liquid film is bounded by the at least one liquid film-repelling surface region;

contacting a suspension that comprises dispersed semiconducting single-walled carbon nanotubes with the at least one liquid film, wherein the suspension is immiscible with the at least one liquid film, such that the at least one liquid film and the suspension form an interface and semiconducting single-walled carbon nanotubes are transferred from the suspension to a surface of the at least one liquid film at the interface, wherein the semiconducting single-walled carbon nanotubes form a liquid crystal on the surface of the at least one liquid film; and allowing the at least one liquid film to dissipate, whereby the semiconducting single-walled carbon nanotubes are deposited on the at least one liquid film-adsorbing surface region along a contact line defined by: the liquid film; the substrate; and the suspension or air, as the liquid film dissipates.

18. A method of patterning a silicon dioxide surface of a substrate with one or more hydrophilic surface regions bounded by one or more less hydrophilic surface regions, the method comprising:

forming a layer of resist on the silicon dioxide surface;

patterning the layer of resist to expose one or more regions of the silicon dioxide surface through the layer of resist;

depositing a layer of yttrium metal or a layer of scandium metal over the layer of resist and the one or more exposed regions of the silicon dioxide surface to form yttrium metal-coated or scandium metal-coated surface regions on the silicon dioxide surface;

removing the patterned layer of resist from the silicon dioxide surface;

oxidizing the yttrium metal or scandium metal on the silicon dioxide surface;

forming a layer of material having a lower hydrophilicity than the silicon dioxide on the silicon dioxide surface and over the oxidized yttrium or oxidized scandium; and removing the oxidized yttrium or oxidized scandium from the silicon dioxide surface to form one or more hydrophilic silicon dioxide surface regions bounded by the material having the lower hydrophilicity than the silicon dioxide.

19. A method of forming a film of aligned elongated nanoparticles on a substrate, the method comprising:

providing a substrate having at least one liquid film-adsorbing surface region bounded by at least one liquid film-repelling surface region;

forming a liquid film on the at least one liquid film-adsorbing surface region by flowing a liquid over the substrate, whereby the liquid is selectively retained on the at least one liquid film-adsorbing surface region, but not on the at least one liquid film-repelling surface region, such that the liquid film is bounded by the at least one liquid film-repelling surface region; and contacting a suspension that comprises dispersed elongated nanoparticles with the at least one liquid film by flowing the suspension over the substrate after the liquid has been flowed over the substrate and the at least one liquid film has been formed, wherein the suspension is immiscible with the at least one liquid film, such that the at least one liquid film and the suspension form an interface and elongated nanoparticles are transferred from the suspension to a surface of the at least one liquid film at the interface; and allowing the at least one liquid film to dissipate, whereby the elongated nanoparticles are deposited on the at least one liquid film-adsorbing surface region along a contact line defined by: the liquid film; the substrate; and the suspension or air, as the liquid film dissipates.

20. The method of claim 19, wherein the at least one liquid film-adsorbing surface region and the at least one liquid film-repelling surface region are co-planar on a surface of the substrate.

* * * * *